US007904040B2

(12) United States Patent
Khoini-Poorfard et al.

(10) Patent No.: US 7,904,040 B2
(45) Date of Patent: *Mar. 8, 2011

(54) RECEIVER ARCHITECTURES UTILIZING COARSE ANALOG TUNING AND ASSOCIATED METHODS

(75) Inventors: Ramin Khoini-Poorfard, Austin, TX (US); Andrew W. Krone, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 417 days.

This patent is subject to a terminal disclaimer.

(21) Appl. No.: 12/004,006

(22) Filed: Dec. 19, 2007

(65) Prior Publication Data
US 2008/0250460 A1    Oct. 9, 2008

Related U.S. Application Data

(63) Continuation of application No. 10/412,963, filed on Apr. 14, 2003, now Pat. No. 7,340,230.

(51) Int. Cl.
*H04B 7/08* (2006.01)
(52) U.S. Cl. ........... 455/132; 455/182.3; 375/136; 375/146; 375/147
(58) Field of Classification Search ............. 455/132, 455/139.2, 182.3, 179
See application file for complete search history.

(56) References Cited

U.S. PATENT DOCUMENTS

| 5,210,504 A | 5/1993 | Yagita et al. ............ 330/253 |
| 5,280,636 A | 1/1994 | Kelley et al. ............ 455/131 |
| 5,375,146 A | 12/1994 | Chalmers ............ 375/103 |
| 5,392,450 A | 2/1995 | Nossen ............ 455/12.1 |
| 5,446,756 A | 8/1995 | Mallinckrodt ............ 375/130 |
| 5,617,090 A | 4/1997 | Ma et al. ............ 341/141 |
| 5,742,638 A | 4/1998 | Smith ............ 375/200 |
| 5,752,174 A | 5/1998 | Matai et al. ............ 455/183.1 |

(Continued)

FOREIGN PATENT DOCUMENTS

CN    1384610 A    11/2002
(Continued)

OTHER PUBLICATIONS

European Patent Office, EP04749871, "*Supplemental Search Report*," dated Jan. 21, 2008.
(Continued)

*Primary Examiner* — Nay Maung
*Assistant Examiner* — Richard Chan
(74) *Attorney, Agent, or Firm* — O'Keefe, Egan, Peterman & Enders. LLP

(57) ABSTRACT

Receiver architectures and associated methods are disclosed that provide initial analog coarse tuning of desired channels within a received signal spectrum, such as a set-top box signal spectrum for satellite communications. These architectures provide significant advantages over prior direct down-conversion (DDC) architectures and low intermediate-frequency (IF) architectures, particularly where two tuners are desired on the same integrated circuit. Rather than using a low-IF frequency or directly converting the desired channel frequency to DC, initial coarse tuning provided by analog coarse tuning circuitry allows for a conversion to a frequency range around DC. This coarse tuning circuitry can be implemented, for example, using a large-step local oscillator (LO) that provides a coarse tune analog mixing signal. Once mixed down, the desired channel may then be fine-tuned through digital processing, such as through the use of a wide-band analog-to-digital converter (ADC) or a narrow-band tunable bandpass ADC.

20 Claims, 20 Drawing Sheets

U.S. PATENT DOCUMENTS

| | | | |
|---|---|---|---|
| 5,841,814 A | 11/1998 | Cupo | 375/321 |
| 5,861,831 A | 1/1999 | Murden et al. | 341/139 |
| 5,892,823 A | 4/1999 | Stelman | 379/390.01 |
| 5,901,184 A | 5/1999 | Ben-Efraim et al. | 375/344 |
| 5,982,823 A | 11/1999 | Jacklin | 375/344 |
| 6,026,129 A | 2/2000 | Ohta et al. | 375/332 |
| 6,031,878 A | 2/2000 | Tomasz et al. | 375/316 |
| 6,091,931 A | 7/2000 | Ben-Efraim et al. | 264/496 |
| 6,104,764 A | 8/2000 | Ohta et al. | 375/332 |
| 6,118,824 A | 9/2000 | Smith et al. | 375/259 |
| 6,134,429 A | 10/2000 | Feyfant et al. | 455/324 |
| 6,148,184 A | 11/2000 | Manku et al. | 455/110 |
| 6,218,972 B1 | 4/2001 | Groshong | 341/143 |
| 6,282,249 B1 | 8/2001 | Tomesen et al. | 375/327 |
| 6,332,006 B1 | 12/2001 | Rybeck et al. | 375/262 |
| 6,353,645 B1 | 3/2002 | Solve et al. | 375/354 |
| 6,356,736 B2 | 3/2002 | Tomasz et al. | 455/3.02 |
| 6,363,262 B1 | 3/2002 | McNichol | 455/561 |
| 6,377,315 B1 | 4/2002 | Carr et al. | 348/726 |
| 6,385,262 B1 | 5/2002 | Gustafsson et al. | 375/350 |
| 6,427,068 B1 | 7/2002 | Suominen | 455/302 |
| 6,449,244 B1 | 9/2002 | Loseke | 370/208 |
| 6,477,196 B1 | 11/2002 | Swanke et al. | 375/147 |
| 6,486,809 B1 | 11/2002 | Figoli | 341/141 |
| 6,507,298 B1 | 1/2003 | Barrenscheen et al. | 341/141 |
| 6,509,934 B1 | 1/2003 | Bao et al. | 348/570 |
| 6,512,472 B1 | 1/2003 | Smith et al. | 341/155 |
| 6,545,728 B1 | 4/2003 | Patel et al. | 348/725 |
| 6,549,774 B1 | 4/2003 | Titlebaum et al. | 455/427 |
| 6,567,654 B1 | 5/2003 | Coronel Arredondo et al. | 455/315 |
| 6,621,433 B1 | 9/2003 | Hertz | 341/139 |
| 6,622,007 B2 | 9/2003 | Linden | 455/12.1 |
| 6,625,464 B1 | 9/2003 | Bandy et al. | 455/503 |
| 6,631,255 B1 | 10/2003 | Claxton et al. | 455/203 |
| 6,677,893 B2 | 1/2004 | Rideout et al. | 342/353 |
| 6,765,535 B1 | 7/2004 | Brown et al. | 343/700 MS |
| 6,801,567 B1 | 10/2004 | Schmidl et al. | 375/149 |
| 6,819,274 B2 | 11/2004 | Krone et al. | 341/141 |
| 6,876,839 B2 | 4/2005 | Harris | 455/141 |
| 6,888,580 B2 | 5/2005 | Dujmenovic | 348/731 |
| 6,912,378 B2 | 6/2005 | Morewitz, II et al. | 455/150.1 |
| 7,167,694 B2 | 1/2007 | Khoini-Poorfard et al. | 455/132 |
| 7,340,230 B2 * | 3/2008 | Khoini-Poorfard et al. | 455/132 |
| 2002/0090924 A1 | 7/2002 | Suominen | 455/302 |
| 2002/0118308 A1 | 8/2002 | Dujmenovic | 348/731 |
| 2003/0054783 A1 | 3/2003 | Mason et al. | 455/150.1 |
| 2004/0205827 A1 | 10/2004 | Krone | 725/131 |

FOREIGN PATENT DOCUMENTS

| | | |
|---|---|---|
| EP | 1220441 A2 | 7/2002 |
| EP | 1220441 A3 | 7/2002 |
| GB | 2347284 A | 8/2000 |
| WO | 02/077662 A1 | 10/2002 |

OTHER PUBLICATIONS

Brett, et al., "*A Direct-Conversion L-Band Tuner for Digital DBS*," ISSCC 98/Session 8/Wireless Receivers/Paper FA 8.3, IEEE International Solid-State Circuits Conference (1998).

Jayaraman, et al., "*A Fully Integrated Broadband Direct-Conversion Receiver for DBS Applications*," ISSCC 2000/Session 8/Wireless RX/TX/Paper TA 8.2, IEEE International Solid-State Circuits Conference (2000).

Conexant Data Sheet No. 100584A, "*CX24108 Digital Satellite Tuner*," Nov. 2000.

Vaucher, et al., "*A Wide-Band Tuning System for Fully Integrated Satellite Receivers*," IEEE Journal of Solid-State Circuits, vol. 33, No. 7, Jul. 1998.

PCT International Search Report, PCT/US04/10765, filed Apr. 7, 2004.

\* cited by examiner

RECEIVER ARCHITECTURES UTILIZING COARSE ANALOG TUNING AND ASSOCIATED METHODS

RELATED APPLICATIONS

This application is a continuation application of Ser. No. 10/412,963, filed Apr. 14, 2003 now U.S. Pat. No. 7,340,230, and entitled "RECEIVER ARCHITECTURES UTILIZING COARSE ANALOG TUNING AND ASSOCIATED METHODS," which is hereby incorporated by reference in its entirety.

TECHNICAL FIELD OF THE INVENTION

This invention relates to receiver architectures for high frequency transmissions and more particularly to set-top box receiver architectures for satellite television communications.

BACKGROUND

In general, the most ideal receiver architecture for an integrated circuit from a bill-of-material point of view is usually a direct down conversion (DDC) architecture. However, in practice, there are several issues that often prohibit the practical design of integrated circuit implementations that use DDC architectures. These issues typically include noise from the DC offset voltage and 1/f noise from baseband circuitry located on the integrated circuit. In mobile applications, such as with cellular phones, the DC offset voltage is a time varying entity which makes its cancellation a very difficult task. In other applications where mobility is not a concern, such as with satellite receivers, the DC offset voltage can be stored and cancelled, such as through the use of external storage capacitors. However, 1/f noise is still an issue and often degrades CMOS satellite tuners that use a DDC architecture.

Conventional home satellite television systems utilize a fixed dish antenna to receive satellite communications. After receiving the satellite signal, the dish antenna circuitry sends a satellite spectrum signal to a satellite receiver or set-top box that is often located near a television through which the viewer desires to watch the satellite programming. This satellite receiver uses receive path circuitry to tune the program channel that was selected by the user. Throughout the world, the satellite channel spectrum sent to the set-top box is often structured to include 32 transponder channels between 950 MHz and 2150 MHz with each transponder channel carrying a number of different program channels. Each transponder will typically transmit multiple program channels that are time-multiplexed on one carrier signal. Alternatively, the multiple program channels may be frequency multiplexed within the output of each transponder. The total number of received program channels considering all the transponders together is typically well over 300 program channels.

Conventional architectures for set-top box satellite receivers include low intermediate-frequency (IF) architectures and DDC architectures. Low-IF architectures utilize two mixing frequencies. The first mixing frequency is designed to be a variable frequency that is used to mix the selected satellite transponder channel to a pre-selected IF frequency that is close to DC. And the second mixing frequency is designed to be the low-IF frequency that is used to mix the satellite spectrum to DC. Direct down conversion (DDC) architectures utilize a single mixing frequency. This mixing frequency is designed to be a variable frequency that is used to mix the selected satellite transponder channel directly to DC.

As indicated above, DDC architectures are desirable due to the efficiencies they provide. DDC architectures, however, suffer from disadvantages such as susceptibility to DC noise, 1/f noise and I/Q path imbalances. DDC architectures also often require narrow-band PLLs to provide mixing frequencies, and implementations of such narrow-band PLLs typically utilize LC-based voltage controlled oscillators (VCOs). Low-IF architectures, like DDC architectures, also typically require the use of such narrow-band PLLs with LC-based VCOs. Such LC-based VCOs are often difficult to tune over wide frequency ranges and often are prone to magnetically pick up any magnetically radiated noise. In addition, interference problems arise because the center frequency for the selected transponder channel and the DDC mixing signal are typically at the same frequency or are very close in frequency. To solve this interference problem, some systems have implemented receivers where the DDC mixing frequency is double (or half) of what the required frequency is, and at the mixer input, a divider (or doubler) translates the DDC mixing signal into the wanted frequency. Furthermore, where two tuners are desired on the same integrated circuit, two DDC receivers, as well as two low-IF receivers, will have a tendency to interfere with each other, and their VCOs also have a tendency to inter-lock into one another, particularly where the selected transponder channels for each tuner are close together.

SUMMARY OF THE INVENTION

The present invention provides receiver architectures and associated methods that utilize coarse analog tune circuitry to provide initial analog coarse tuning of desired channels within a received spectrum signal, such as a set-top box signal spectrum for satellite communications. These architectures, as described in detail below, provide significant advantages over prior direct down-conversion (DDC) architectures and low intermediate-frequency (IF) architectures, particularly where two tuners are desired on the same integrated circuit. Rather than using a low-IF frequency or directly converting the desired channel frequency to DC, initial coarse tuning provided by analog coarse tuning circuitry allows for a conversion to a frequency range around DC. This coarse tuning circuitry can be implemented, for example, using a large-step local oscillator (LO) that provides a coarse tune analog mixing signal. Once mixed down, the desired channel may then be fine-tuned through digital processing, such as through the use of a wide-band analog-to-digital converter (ADC) or a narrow-band tunable bandpass ADC. The disclosed architectures, therefore, have the efficiency of using a single mixing frequency while still avoiding interference and noise problems that plague DDC architectures.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

The present invention provides receiver architectures and associated methods that coarse analog tune circuitry to provide initial analog coarse tuning of desired channels within a received signal spectrum. In the description of the present invention below, the signal spectrum is primarily described with respect to a satellite transponder channel spectrum; however, it is noted that the receiver architecture and methods of the present invention could be used with other channel signal spectrums utilized by other systems, if desired.

Figure 1A:
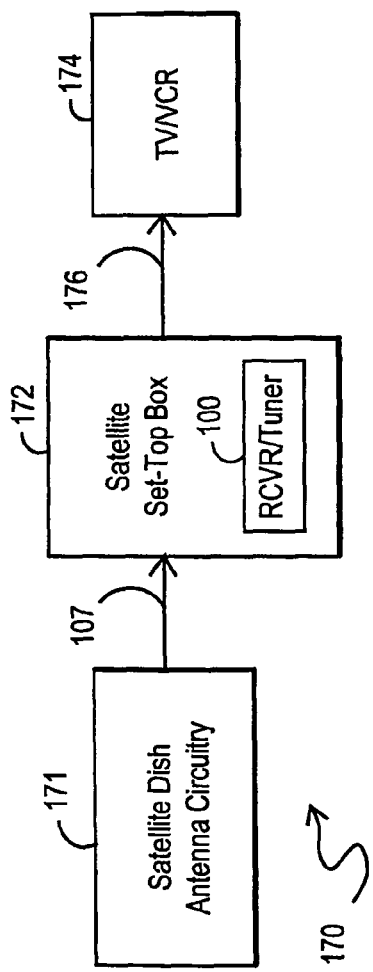
FIG. 1A is a block diagram for an example satellite set-top box environment within which the receiver architecture of the present invention could be utilized.

FIG. 1A is a block diagram for an example satellite set-top box environment 170 within which the receiver or tuner architecture 100 of the present invention could be utilized. In the embodiment depicted, a satellite set-top box 172 receives an input signal spectrum from satellite dish antenna circuitry 171. The satellite set-top box 172 processes this signal spectrum in part utilizing the receiver/tuner circuitry 100. The output from the satellite set-top box 172 is then provided to a television, a videocassette recorder (VCR) or other device as represented by the TV/VCR block 174.

Figure 1B:
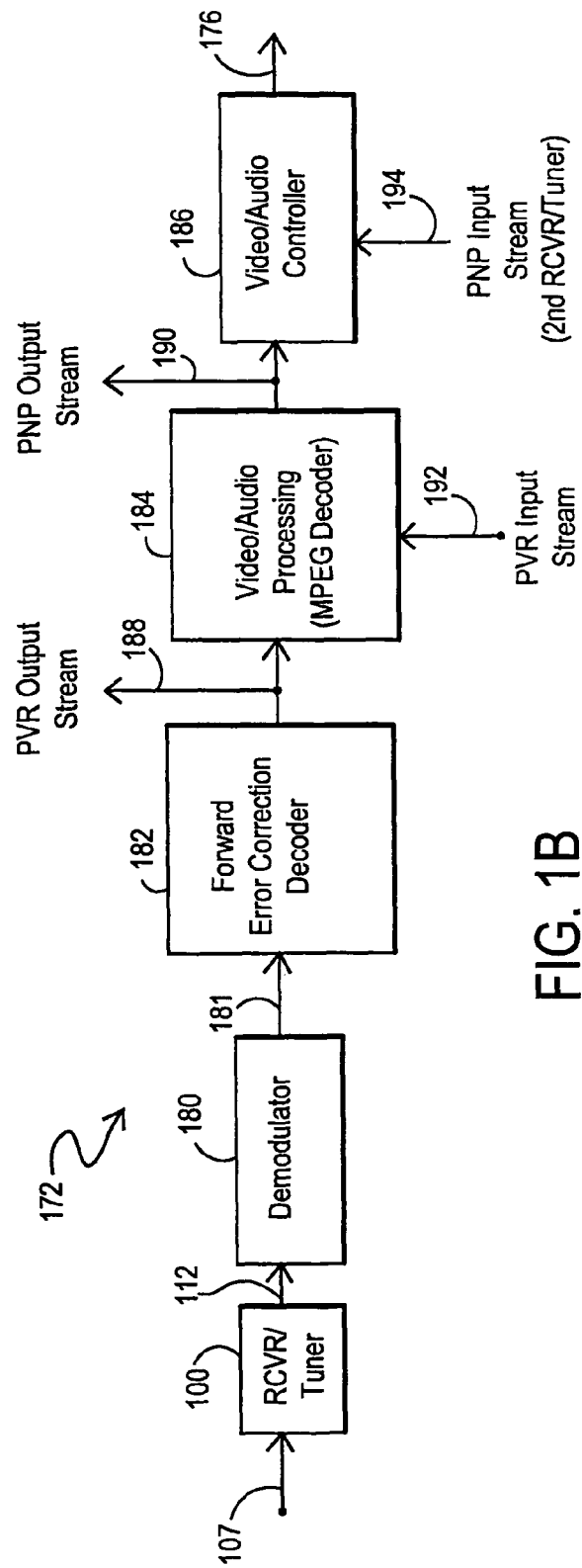
FIG. 1B is a block diagram for example satellite set-top box circuitry that could include the receiver architecture of the present invention.

FIG. 1B is a block diagram for example circuitry for a satellite set-top box 172 that could include the receiver architecture 100 of the present invention. The input signal spectrum 107 can be, for example, 32 transponder channels between 950 MHz and 2150 MHz with each transponder channel carrying a number of different program channels. This signal spectrum 107 can be processed by the receiver/tuner 100 to provide digital baseband output signals 112 that represent a tuned transponder channel. These output signals 112 can then be processed by a demodulator 180 that can tune one of the program channels within the tuned transponder channel. The output signal 181 from the demodulator, which represents a tuned program channel within the transponder channel that was tuned by the receiver/tuner 100, can then be processed with a forward error correction decoder 182 to produce a digital output stream. This digital output stream is typically the data stream that stored by personal video recorders (PVRs) for later use and viewing by a user as represented by the PVR output stream 188. The output of the decoder 182, or the stored PVR data as represented by PVR input stream 192, can then be processed by video/audio processing circuitry 184 that can include processing circuitry such as an MPEG decoder. The output of the processing circuitry 184 is typically the digital video data stream that represents the program channel and is used for picture-in-picture (PnP) operations, for example, where the set-top box circuitry 172 includes two tuners with one tuner providing the primary viewing feed and a second tuner providing the PnP viewing feed. The output of the processing circuitry 184, as well as a PnP input stream 194 from a second tuner if a second tuner is being utilized for PnP operations, can be processed by a video/audio controller 186 to generate a video output signal 176 that can subsequently be utilized, for example, with a TV or VCR. Additional tuners could also be used, if desired.

Figure 1C:
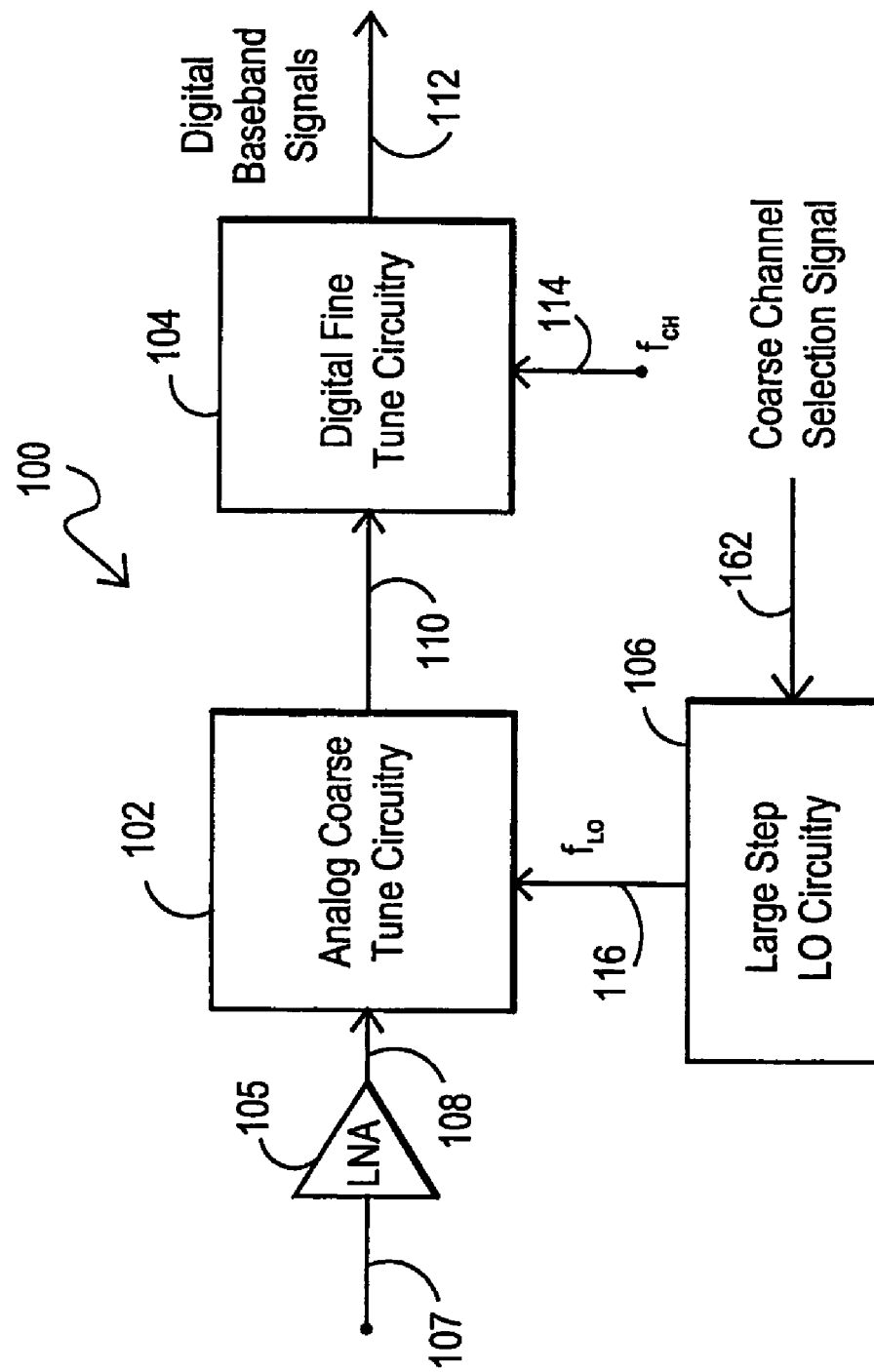
FIG. 1C is a block diagram of basic receiver architecture according to the present invention utilizing a large-step local oscillator.

FIG. 1C is a block diagram of basic receiver architecture 100 according to the present invention utilizing a large-step local oscillator 106. Input signal 107, for example from a satellite dish antenna or other source, is received and passed through a low noise automatic-gain amplifier (LNA) 105. In the embodiments described herein, it is assumed that the input signal 107 is a signal spectrum that includes multiple channels, such as a satellite television signals that includes 32 transponder channels between the frequencies of 950 MHz and 2150 MHz. The output signal 108 from LNA 105 is initially tuned with analog coarse tune circuitry 102 utilizing a local oscillator mixing frequency ($f_{LO}$) provided by large-step local oscillator (LO) circuitry 106. The large-step LO circuitry 106 also receives a coarse channel selection signal 162. The resulting coarsely tuned signal 110 is then subjected to digital fine tune circuitry 104 utilizing the center frequency ($f_{CH}$) 114 for the desired channel to produce digital baseband signals 112.

Figure 1D:
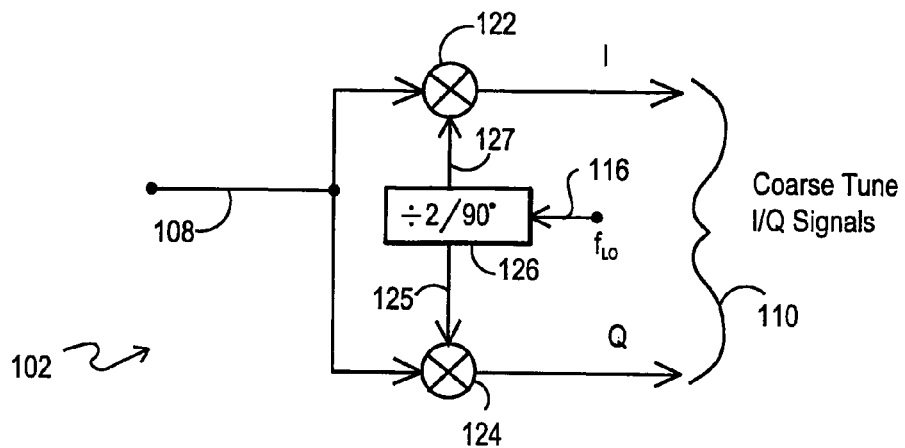
FIG. 1D is a block diagram of an embodiment for coarse tune circuitry.

FIG. 1D is a block diagram of an embodiment for coarse tune circuitry 102. The channel spectrum signal 108 is sent to mixers 122 and 124. The output Q signal from mixer 124 is desired to be offset by a phase shift of 90 degrees from the output I signal from mixer 122. To provide these two signals, a local oscillator mixing frequency ($f_{LO}$) 116 and a dual divide-by-two and quadrature shift block (÷2/90°) 126 may be utilized. The local oscillator mixing frequency ($f_{LO}$) 116 is divided by two in block 126 to provide mixing signals 125 and 127. Block 126 also delays the signal 125 to mixer 124 by 90 degrees with respect to the signal 127 to mixer 122. Mixer 122 mixes the channel spectrum signal 108 with the signal 1277 to provide an in-phase signal (I) for the coarse tune I/Q signals 110. And mixer 124 mixes the channel spectrum signal 108 with the signal 125 to provide the quadrature signal (Q) for the coarse tuned I/Q signals 110. Because the dual divide-by-two and quadrature shift block (÷2/90°) 126 will divide the local oscillator mixing frequency ($f_{LO}$) 116 by two, the local oscillator mixing freq frequency ($f_{LO}$) 116 will be two-times the desired mixing frequency for the mixers 122 and 124. It is also noted that the block 126 could be modified, if desired, to provide any desired frequency division, such as a divide-by-four operation, assuming that a corresponding change were made to the local oscillator mixing frequency ($f_{LO}$) 116 so that the desired mixing frequency was still received by the mixers 122 and 124. It is further noted that block 126 could simply provide a quadrature phase shift and provide no frequency division, such that the local oscillator mixing frequency ($f_{LO}$) 116 is directly used by the mixers 122 and 124 except for the 90 degrees phase shift between the two signal 125 and 127.

Figure 1E:
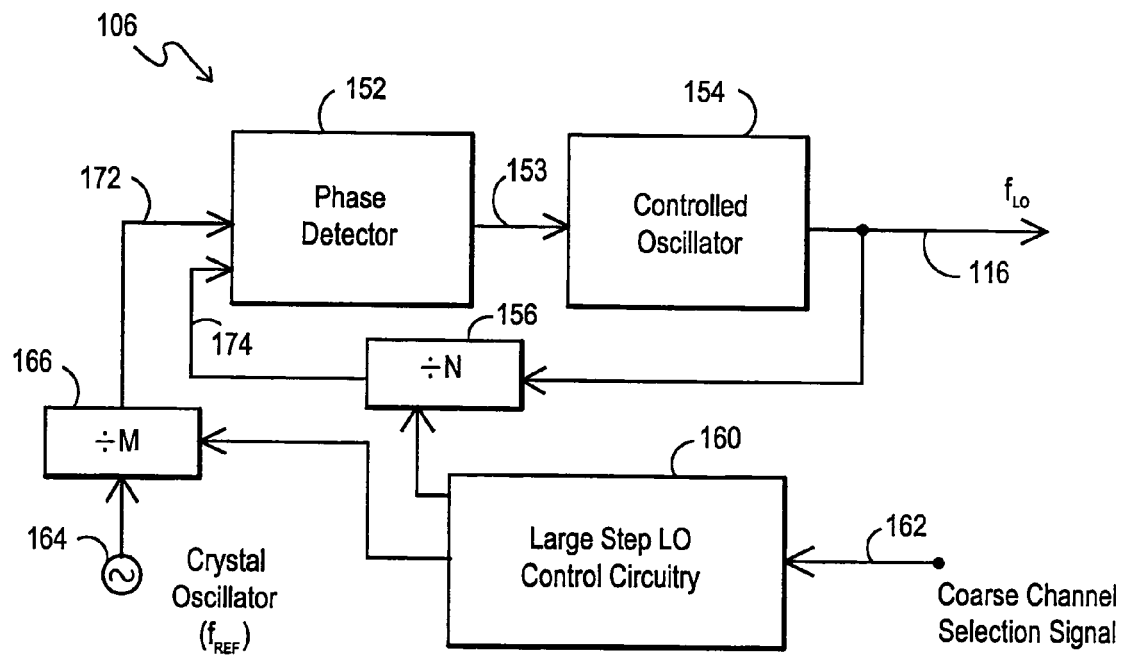
FIG. 1E is a block diagram of an embodiment for a large-step local oscillator.

FIG. 1E is a block diagram of an embodiment for a large-step local oscillator 106. The large-step local oscillator 106, according to the present invention, is designed to generate a mixing signal at one of a plurality of predetermined frequencies. The output LO frequency is selected based upon the channel within the spectrum that is desired to be tuned. The output LO frequencies can be organized and uniformly or non-uniformly spaced as desired. As one example, the output LO frequencies can be a fixed bandwidth apart from each other and can span the entire input channel spectrum signal 108. In the embodiment depicted, the local oscillator mixing frequency ($f_{LO}$) 116 is generated using phase-lock-loop (PLL) circuitry. The phase detector 152 receives a signal 172 that represents a divided version of a reference frequency ($f_{REF}$) and signal 174 that represents a divided version of the output frequency ($f_{LO}$) 116. A reference frequency ($f_{REF}$) can be generated, for example, using crystal oscillator 164. The output of the crystal oscillator 164 is provided to divide-by-M block 166 to produce the signal 172. The output frequency ($f_{LO}$) 116 is provided to divide-by-N block 156 to produce the signal 174. The dividers 156 and 166 are controlled by large-step LO control circuitry 160. Based upon a coarse channel selection signal 162, which represents information identifying the channel that is desired to be tuned, the control circuitry 160 sets the dividers 156 and 166 to generate a desired output frequency ($f_{LO}$) 116. Depending upon these settings for the dividers 156 and 166, the phase detector 152 and controlled oscillator 154 act together to provide phase-lock-loop (PLL) circuitry that attempts to lock the output frequency ($f_{LO}$) 116 to a selected LO mixing frequency, as described in more detail below.

In operation, the phase detector 152 provides a control input 153 to the controlled oscillator 154 in order to control the output frequency of the controlled oscillator 154. The nature of this control input 153 will depend upon the circuitry used to implement the controlled oscillator 154. For example, if a voltage controlled oscillator (VCO) is used, the control input 153 can include one or more voltage control signals. If LC-tank oscillator architecture is utilized for the VCO, one or more voltage control signals could be used to control one or more variable capacitances within the VCO circuitry. Advantageously, the large-step LO receiver architecture of the present invention allows for the use of less precise oscillator architectures, such as RC-based oscillator architectures. One RC-based oscillator architecture that could be used is a inverter-based ring oscillator where the delay of each inverter stage can be adjusting using one or more control signals as the control input 153. It is noted, therefore, that a wide variety of oscillator architectures and associated control signals could be used for the controlled oscillator 154 and the control input 153. This wide variety of applicable architectures is in part due to the wide-band nature of the PLL that can be utilized with the architecture of the present invention, which in turn causes the output phase noise to track the phase noise of the reference oscillator over a wider spectrum range thereby relaxing the required VCO phase noise specifications.

Figure 2A:
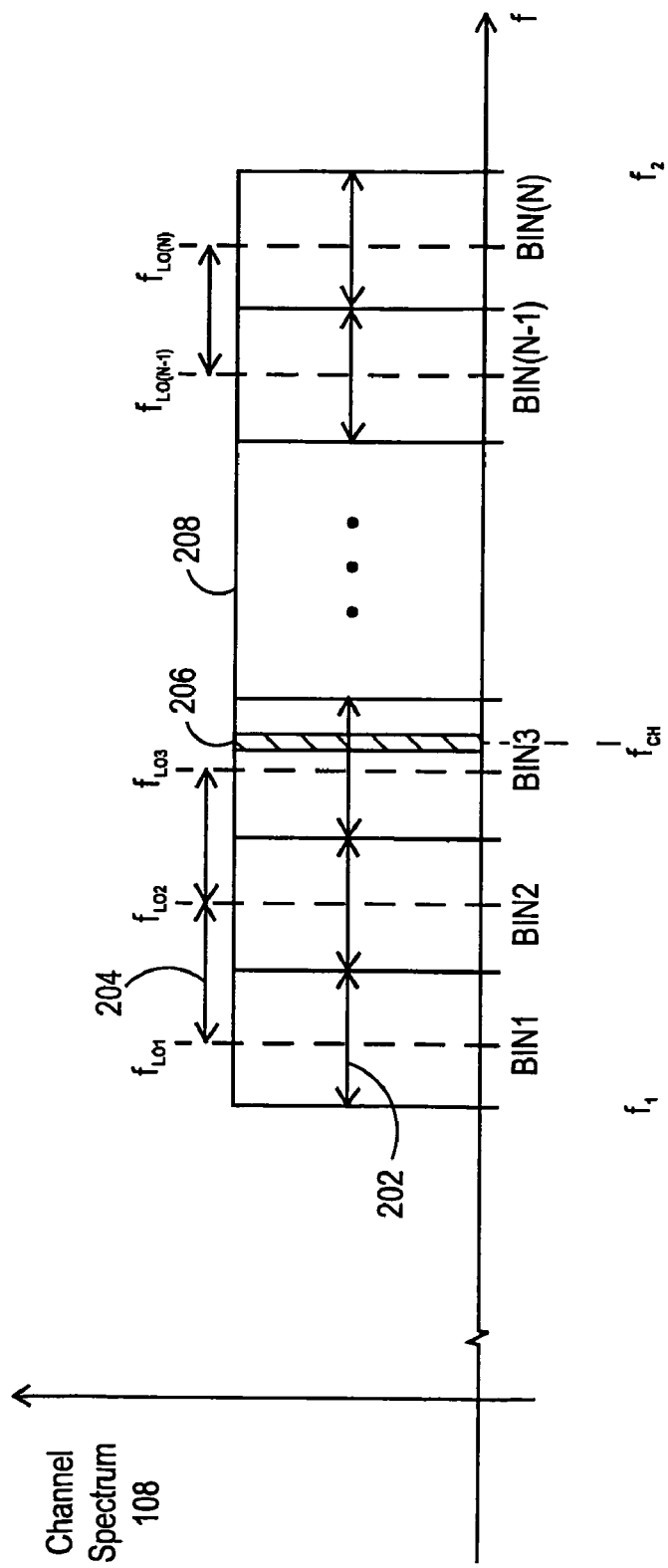
FIG. 2A is a diagram for an example channel spectrum signal with predetermined frequency bins spanning the channel spectrum.

FIG. 2A is a diagram for an example channel spectrum signal 108 with predetermined frequency bins spanning the channel spectrum 208. The channel spectrum can include any number of different channels, such as channel 206 with a center frequency at $f_{CH}$, and the channel spectrum can span any desired frequency range. With respect to satellite set-top box receivers, for example, the channel spectrum includes 32 transponder channels between 950 MHz and 2150 MHz. In the embodiment depicted, the spectrum 208 between frequencies $f_1$ and $f_2$ has been partitioned into N different bins, which are designated BIN1, BIN2, BIN3 . . . BIN(N−1), BIN(N). Each bin has a single pre-selected LO frequency, which are designated $f_{LO1}$, $f_{LO2}$, $f_{LO3}$ . . . $f_{LO(N-1)}$, $f_{LO1(N)}$. If the desired channel 206 falls within the bin, the bin LO frequency can be used as the mixing signal to provide the down conversion of the desired channel to a frequency range around DC. In the embodiment depicted, channel 206 falls within BIN3, and LO frequency $f_{LO3}$ can be used as the mixing signal. In addition, in the embodiment depicted, the width 202 of each bin has been selected to be the same, and the width 204 between each LO frequency has been selected to be the same. It is noted, however, that frequency bin sizes and LO frequencies can be non-uniformly distributed and can be varied or modified depending upon the implementation desired. In addition, multiple LO frequencies per bin could be used and different numbers of LO frequencies could also be used depending upon the implementation desired.

Figure 2B:
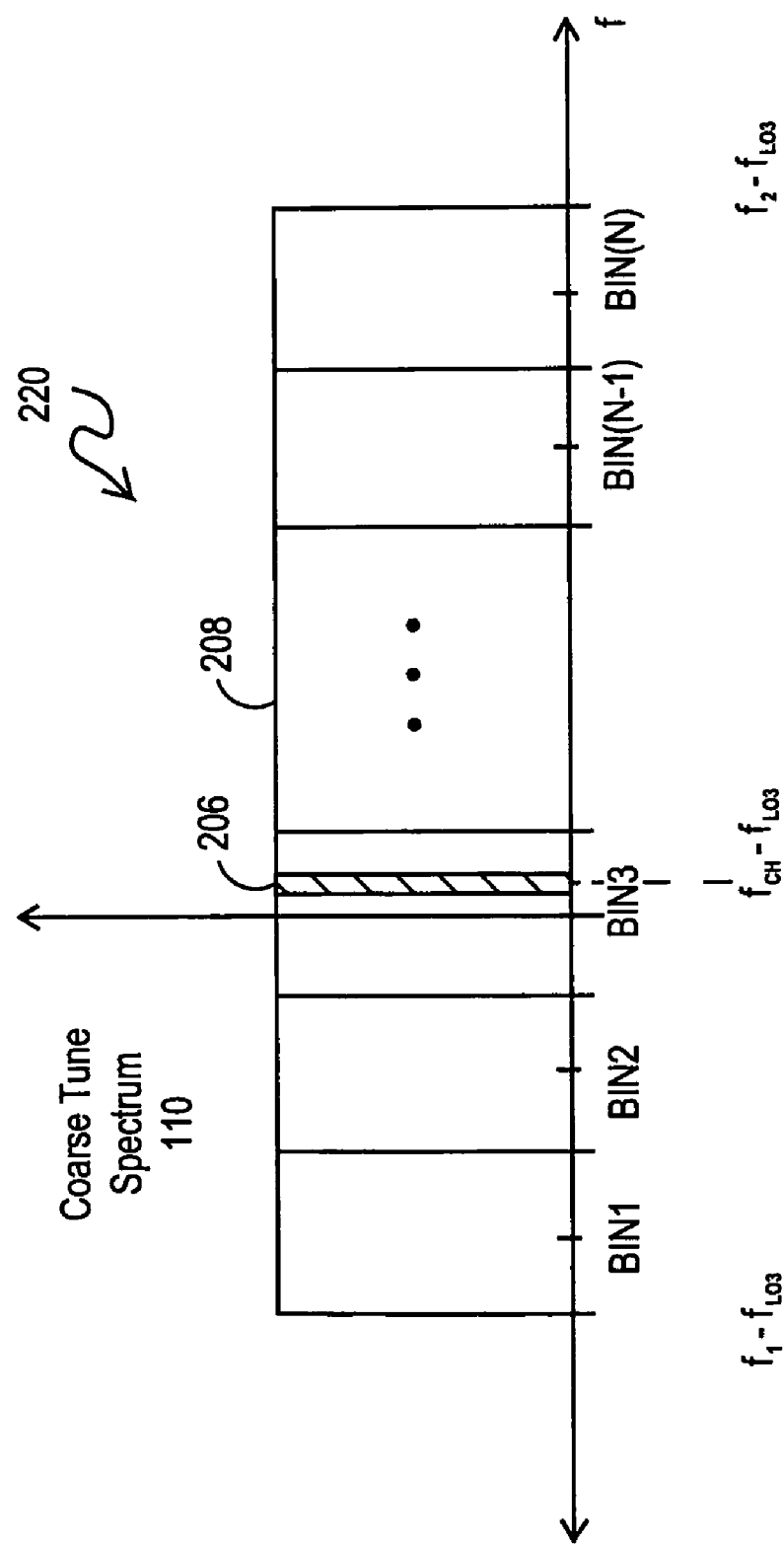
FIG. 2B is a diagram for an example coarse tune signal spectrum.

FIG. 2B is a diagram for an example coarse tune signal spectrum 10 after it has been mixed with LO frequency $f_{LO3}$. As depicted, the channel spectrum 208 has been moved so that channel 206 is now centered at a resulting frequency that is equal to the channel center frequency ($f_{CH}$) minus the LO mixing frequency ($f_{LO3}$). The spectrum 208 similarly has been mixed down so that the spectrum is now between the frequencies $f_1$-$f_{LO3}$ and $f_2$-$f_{LO3}$.

Figure 2C:
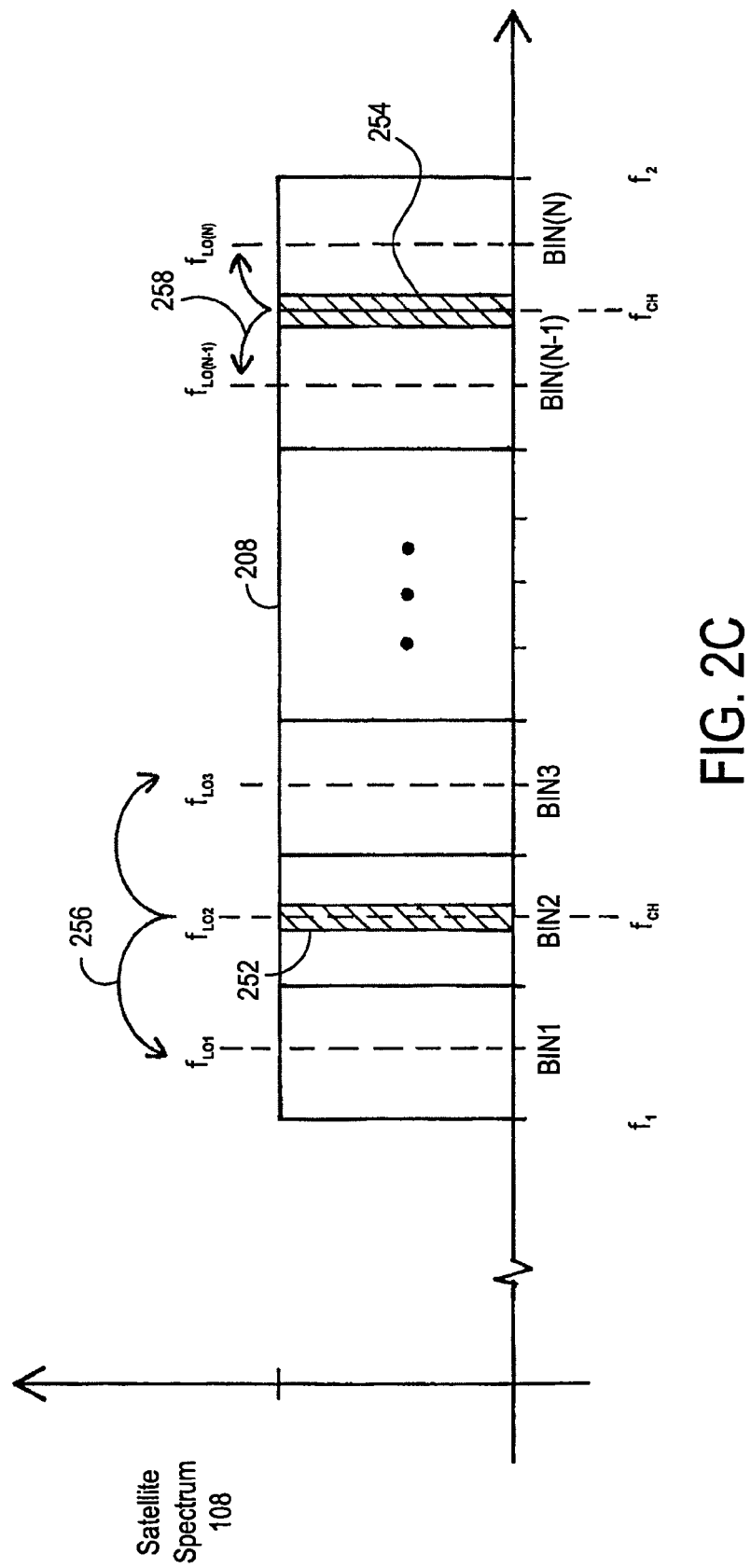
FIG. 2C is a diagram for an example satellite signal spectrum where desired channels overlap a bin local oscillator frequency or a bin-to-bin boundary.

FIG. 2C is a diagram for an example satellite signal spectrum 208 where a desired channel 252 overlaps a bin LO frequency and a desired channel 254 overlaps a bin-to-bin boundary. First, considering channel 254, its channel center frequency ($f_{CH}$) is shown as sitting on top of the boundary between BIN(N−1) and BIN(N). As such, the LO frequency $f_{LO(N-1)}$ for BIN(N−1) or the LO frequency $f_{LO(N)}$ for BIN(N) can be used as represented by the arrows identified by element number 258. Now, considering channel 252, its channel center frequency ($f_{CH}$) is shown as sitting on top of the LO frequency $f_{LO2}$ for BIN2 in which channel 252 falls. If LO frequency $f_{LO2}$ for BIN2 were used to mix down channel 252, the channel center frequency ($f_{CH}$) would land at DC thereby in effect causing a direct down conversion of channel 252. This is an undesirable result according to the architecture of the present invention. Thus, where the channel 252 overlaps the LO frequency for the bin in which it falls, the LO frequency for an adjacent bin can be used as the mixing LO frequency. As depicted, therefore, instead of using LO frequency $f_{LO2}$ for BIN2 to mix down channel 252, the LO frequency $f_{LO1}$ for BIN1 or the LO frequency $f_{LO3}$ for BIN3 can be used as represented by the arrows identified by element number 256, thereby avoiding direct down conversion to DC. It is noted that the decision of which bin LO frequency to use can be made utilizing any of a wide variety of considerations depending upon the particular application and design criterion involved.

Figure 3:
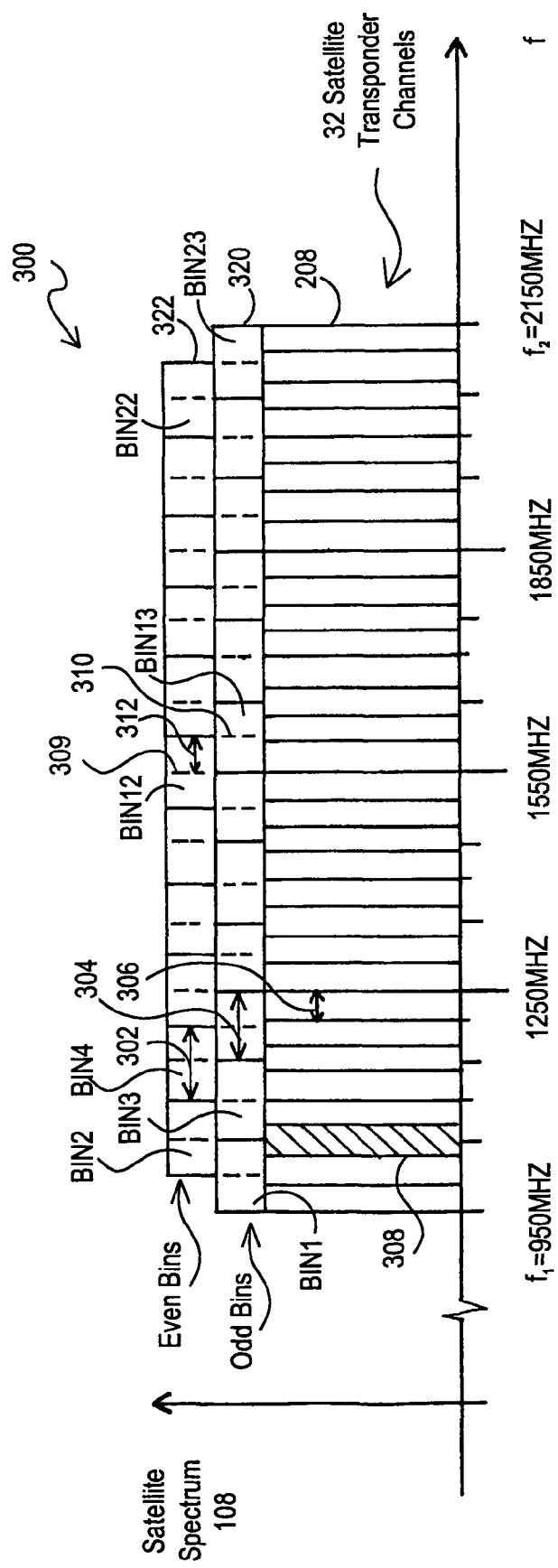
FIG. 3 is a diagram of an embodiment for a overlapping bin architecture for an example 32 channel satellite signal spectrum for a television set-top box.

FIG. 3 is a diagram of an embodiment 300 for an overlapping bin architecture for an example 32 transponder channel satellite signal spectrum for a television set-top box. In particular, the satellite transponder channel spectrum 208 includes 32 transponder channels between 950 MHz and 2150 MHz with each channel being about 37.5 MHz wide. As depicted, channel 308 represents the transponder channel desired to be tuned, and element 306 represents the width of channels. As configured in the embodiment 300, there are 23 overlapping bins configured as 12 odd numbered bins 320 (BIN1, BIN3 . . . BIN 23) and 11 even numbered bins 322 (BIN2, BIN4 . . . BIN22). The width of each odd bin 320 as designated by element 304 can be selected to be the same. The width of each even bin 322 as designated by element 302 can be selected to be the same. And the widths for bins 320 and 322 can be selected to be the same. As discussed above, each bin can be configured to have a LO frequency associated with it that is located at the center of the bin as represented by the dotted lines, such as dotted lines 309 and 310. The width between LO frequencies associated with each consecutive bin, such as between the LO frequencies for BIN12 and BIN13, can be the same as designated by element 312. As such, the width between LO frequencies of consecutively numbered bins is half the width of the bins. For example, if widths 302 and 304 of the odd and even bins are set to 100 MHz, the width or frequency step between LO frequencies for consecutively numbered bins becomes 50 MHz.

An overlapping bin architecture, such as embodiment 300, helps improve the performance and efficiency of the receiver architecture of the present invention by providing redundancy and helping to resolve channels whose center frequencies happen to be at the boundary between two bins. As will be discussed in more detail below, it is often desirable to include two or more receivers in a single integrated circuit and to reduce the frequency range within which the digital fine tune circuitry 104 must operate. In selecting the bin configuration for a channel spectrum, it is advantageous to increase the frequency step between LO frequencies so that adjacent LO frequencies from two or more separate receivers in an integrated multi-tuner satellite receiver are far enough apart to avoid interference with each other. However, it is also advantageous to reduce the frequency step between the LO frequencies to reduce the frequency range within which the digital fine tune circuitry 104 must operate and to relax the design specifications for the digital fine tune circuitry 104, such as, for example, low pass filter (LPF) circuitry and analog-to-digital conversion (ADC) circuitry. For the embodiment 300 of FIG. 3, a 50 MHz frequency step is one reasonable choice for the frequency step when considering the trade-off between minimizing the frequency step while still keeping adjacent LO frequencies separated to avoid interference. It is also noted that a 10 MHz frequency step may also be a desirable frequency step. And it is further noted that other frequency steps or configurations may be chosen depending upon the particular design requirements involved.

With respect to standard satellite tuners and a transponder channel signal spectrum between 950 MHz and 2150 MHz, the local oscillator mixing frequency resolutions are typically on the range of 100 KHz. Thus, where the frequency step is chosen to be 10-50 MHz or more, the coarse tuning provided by the large-step oscillator of the present invention can provide frequency steps that are 100-times or more larger than traditional resolutions. Because the bandwidth of PLLs that provide these local oscillator output signals have a bandwidths that are typically ¹⁄₁₀ of the frequency step, traditional PLLs would be expected to have bandwidths on the range of 10 KHz. In contrast, with the large-step local oscillator of the present invention, the bandwidth of the PLL would likely be more on the order of 1-5 MHz or higher, depending upon the resolution chosen for the coarse tune frequency steps. It is noted that these numbers are provided as examples and should not be considered as limiting the invention. The coarse analog tuning and fine digital tuning architecture discussed herein is applicable to a wide range of applications and not limited to these example embodiments, frequency ranges or bandwidths.

Looking to channel 308 in FIG. 3, it is located within the channel spectrum such that it overlaps the LO frequency for BIN2 and the boundary of BIN1 and BIN2, which are both designed to be located at about 1050 MHz. As discussed above with respect to FIG. 2C, the LO mixing frequency $f_{LO2}$ would not be used to avoid a direct down conversion of channel 308 to DC. Rather, the LO mixing frequency $f_{LO1}$ for BIN1 or the LO mixing frequency $f_{LO3}$ for BIN3 could be used to mix down the channel 308. It is noted that by having overlapping frequency bins, an LO frequency closer to the center frequency for the desired channel 308 could be used. For example, if only the non-overlapping even numbered bins 322 were provided in the embodiment 300, the next adjacent LO mixing frequency would have been LO mixing frequency $f_{LO4}$ for BIN4, which is 100 MHz from the LO mixing frequency $f_{LO2}$ for BIN2, rather than the 50 MHz frequency step between the LO frequencies for BIN2 and BIN1 and for BIN2 and BIN3. As stated above, overlapping bin architecture of FIG. 3 helps resolve boundary or inter-bin channels and helps reduce the bandwidth of the tuned signal thereby reducing the bandwidth requirements for the anti-aliasing filters and reducing the sampling rate requirements for ADC circuitry that may be used in the digital fine tune circuitry. It is noted that a similar result to the overlapping bin approach could be achieved by expanding the number of non-overlapping bins to reduce the frequency step between adjacent LO frequencies. One additional benefit of the overlapping bin architecture, however, is that more than one bin has been designated as covering the same frequency range, thereby providing a desirable level of redundancy.

Figure 4A:
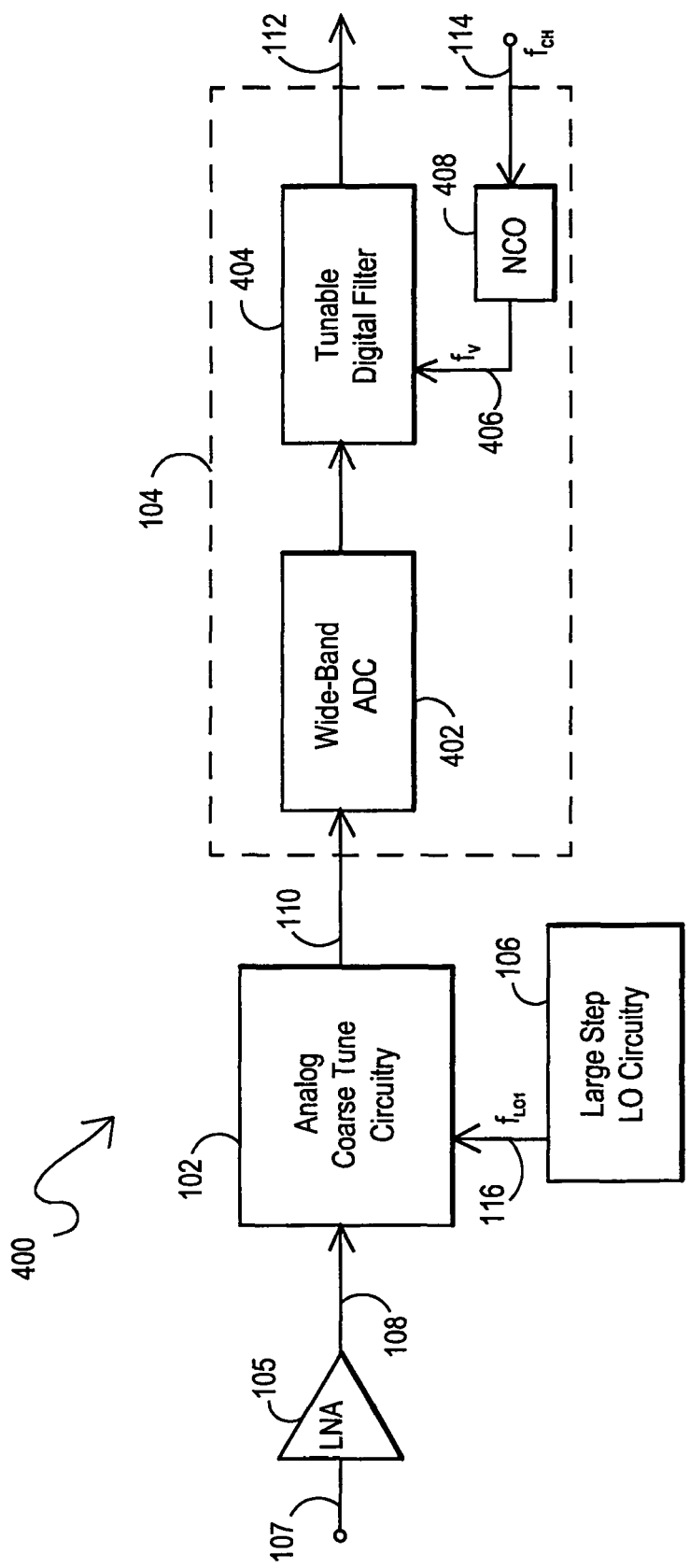
FIGS. 4A and 4B are example embodiments for the basic receiver architecture using a wide-band analog-to-digital converter and a narrow band tunable bandpass analog-to-digital converter, respectively.
Figure 4B:
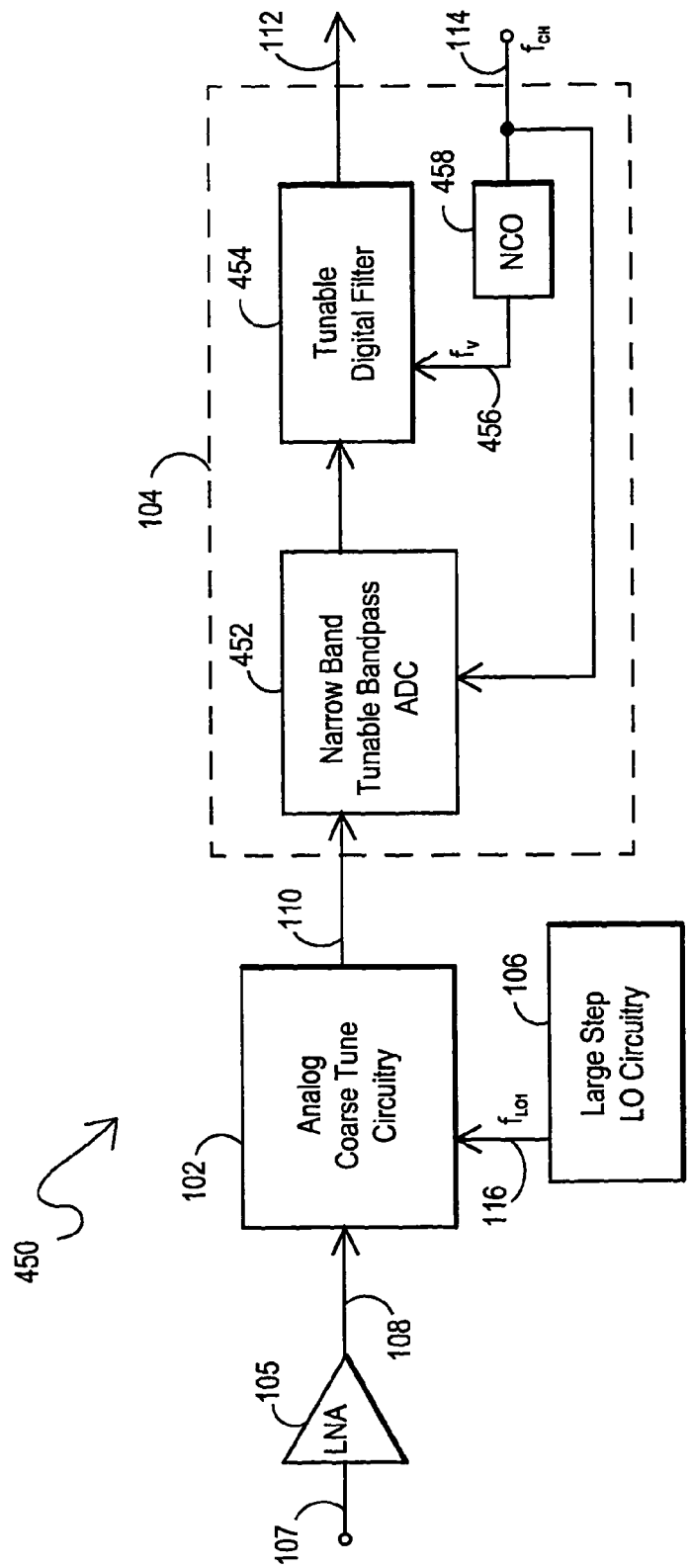

FIGS. 4A and 4B are example implementations for the basic receiver architecture using a wide-band ADC for the digital fine tune circuitry 104 and a narrow band tunable bandpass ADC for the digital fine tune circuitry 104, respectively. In particular, embodiment 400 of FIG. 4A utilizes a wide-band ADC 402 that receives coarsely tuned signal 110 and provides a digital output to a tunable digital filter 404, which in turn outputs the digital baseband signals 112. For fine tuning the desired channel within the signal 110, the tunable digital filter 404 utilizes a variable frequency ($f_V$) 406 generated, for example, by a numerically controlled oscillator (NCO) 408 that in turn receives the center frequency ($f_{CH}$) 114 for the desired channel. Embodiment 450 of FIG. 4B utilizes a narrow-band (complex or real) tunable bandpass ADC 452 that receives the coarsely tuned signal 110 and provides a digital output to a tunable digital filter 454. For tuning the digital output to the desired channel, the narrow-band bandpass ADC utilizes the center frequency ($f_{CH}$) 114 for the desired channel. Additional tuning of the desired channel is provided by the tunable digital filter 454, which utilizes a variable frequency ($f_V$) 456 generated, for example, by a numerically controlled oscillator (NCO) 458 that in turn receives the center frequency ($f_{CH}$) 114 for the desired channel. It is noted that these implementations for providing fine tuning of the coarsely tuned channel spectrum do not mix the desired channel down to a fixed target IF frequency and do not mix the desired channel to DC. Rather, these implementations use the analog coarse tune circuitry 102 to mix the desired channel down to a variable location within a frequency range around DC, and then they perform digital conversion and digital filtering directly on this coarsely tuned channel spectrum.

Figure 5A:
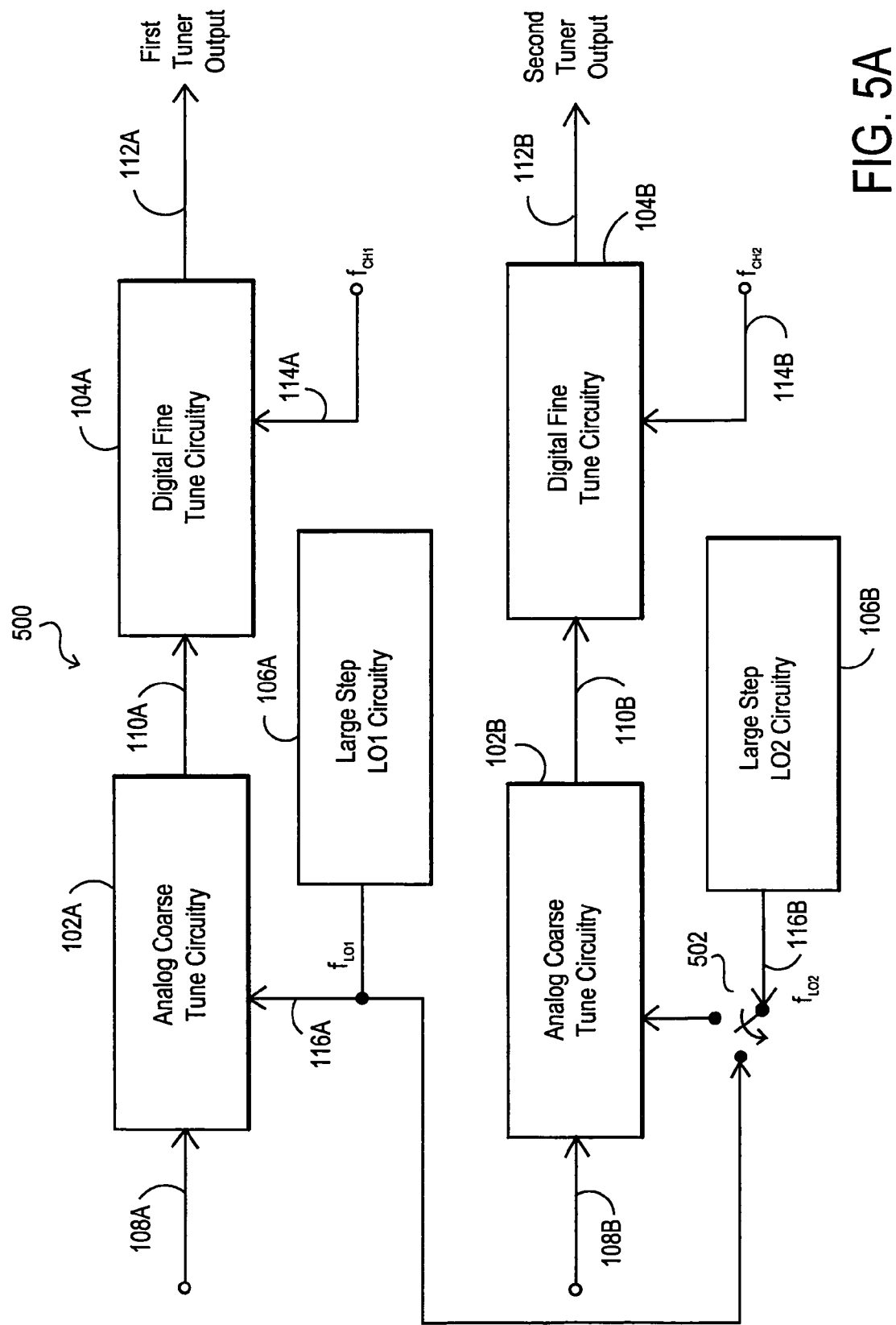
FIG. 5A is a block diagram for a two receiver architecture located on a single integrated circuit.

FIG. 5A is a block diagram of an embodiment 500 for a two receiver architecture located on a single integrated circuit. In general, this embodiment 500 duplicates the circuitry of FIG. 1C to produce a dual receiver architecture. The first receiver includes analog coarse tune circuitry 102A, large-step LO1 circuitry 106A (which outputs a first LO mixing frequency ($f_{LO1}$) 116A), and digital fine tune circuitry 104A (which receives a first center frequency ($f_{CH1}$) 114A for a first desired channel to be tuned). As discussed above, the first receiver coarsely tunes the input channel spectrum 108A to produce the intermediate coarsely tuned channel signal 110A and then digitally processes this signal to finely tune the channel and to produce digital baseband signals for the first tuner output 112A. Similarly, the second receiver includes analog coarse tune circuitry 102B, large-step LO2 circuitry 106B (which outputs a second LO mixing frequency ($f_{LO2}$) 116B), and digital fine tune circuitry 104B (which receives a second center frequency ($f_{CH2}$) 114B for a second desired channel to be tuned). The second receiver coarsely tunes the input channel spectrum 108AB to produce the intermediate coarsely tuned channel signal 110B and then digitally processes this signal to finely tune the channel to produce digital baseband signals for the second tuner output 112B. It is noted that the two tuner embodiments discussed herein are example multi-tuner satellite receiver embodiments and that the architecture of the present invention could be utilized to integrate additional receivers within a single integrated circuit.

Because there are two local oscillators on a single integrated circuit in the embodiment 300 of FIG. 5A, it is possible that the same LO mixing frequency may be selected for use by each of the two receivers, such that $f_{LO1}=f_{LO2}$. In such a case, unless these two frequencies can be precisely matched, they will likely interfere with each other. As one solution to this problem, the dual receiver architecture can be implemented such that the two receivers share a single LO mixing frequency in circumstances where the same LO mixing frequency is in fact selected for use by each of the two receivers ($f_{LO1}=f_{LO2}$). In the embodiment 500 of FIG. 5A, the switch 502 is provided so that the receivers can share the first LO mixing frequency ($f_{LO1}$) in such circumstances. One problem that remains, however, is how to keep the second large-step LO2 circuitry 106B from attempting to output an interfering mixing frequency. Possible solutions to this problem include (1) turning off the second receive path and sharing the first tuner output, (2) turning off the second large-step LO2 circuitry 106B and sharing the first LO mixing frequency ($f_{LO1}$), for example, using a controlled switch 502 as shown in FIG. 5A, or (3) sharing the first LO mixing frequency ($f_{LO1}$) and also causing the large-step LO2 circuitry 106B to move to a non-interfering LO mixing frequency ($f_{LO2}$) that will not be used while the first LO mixing frequency ($f_{LO1}$) is being shared. It is further noted that other techniques and solutions could be implemented, if desired, for addressing the problem of circumstances where the second LO mixing frequency and the first LO mixing frequency would overlap. It is also again noted that the architecture of the present invention could be utilized to integrate additional receivers within a single integrated circuit. For example, if four tuners were utilized, additional receiver circuitry could be integrated with that shown in FIG. 5A to provide additional analog coarse tuning circuitry, digital fine tuning circuitry and LO circuitry for a third receiver and additional analog coarse tuning circuitry, digital fine tuning circuitry and LO circuitry for a fourth receiver. As discussed above, a variety of selection techniques could be implemented for the LO frequencies provided by the different LO circuitries with respect to the multiple receivers such that interfering overlaps of the LO mixing frequencies could be avoided.

Figure 5B:
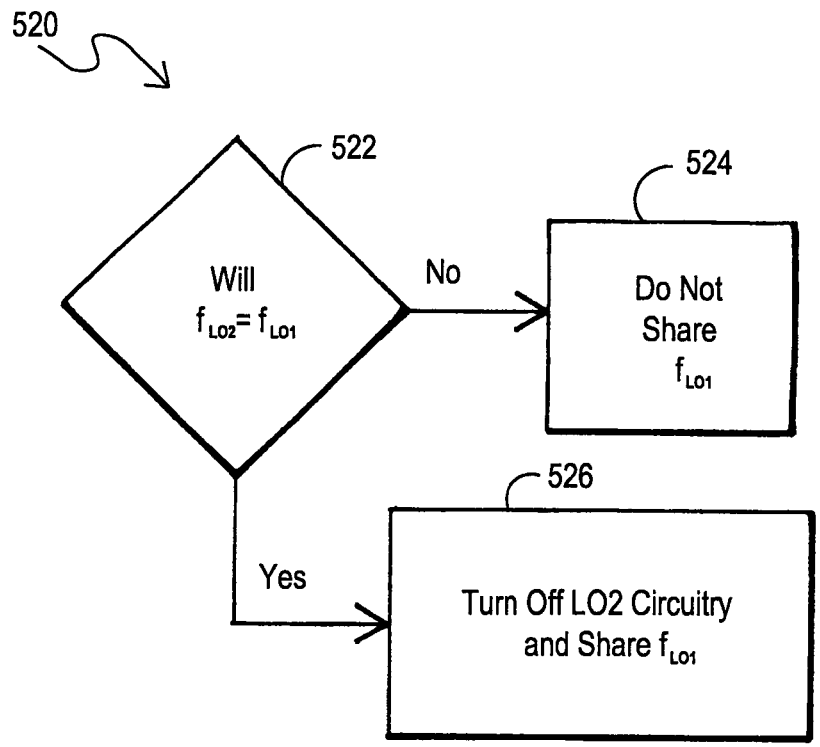
FIGS. 5B and 5C are flow diagrams of example embodiments for sharing a single local oscillator frequency between two receivers.
Figure 5C:
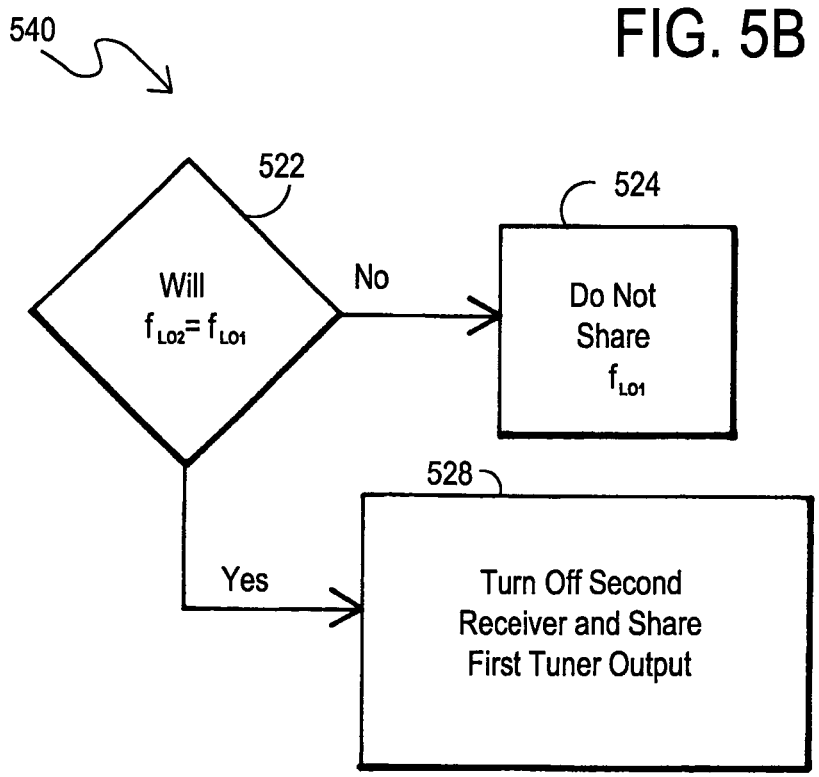

FIGS. 5B and 5C are flow diagrams of example implementations for the first two solutions above for handling the second LO frequency where a single LO frequency is shared between two receivers. In embodiment 520 of FIG. 5B, decision block 522 determines if the two selected LO mixing frequencies will be the same ($f_{LO1}=f_{LO2}$). If the answer is "YES," then in block 526, the first LO mixing frequency ($f_{LO1}$) is shared, and the second local oscillator circuitry (LO2) is powered down and turned off. If the answer is "NO," then in block 524, each LO circuitry operates, and first LO mixing frequency ($f_{LO1}$) is not shared. In the embodiment 540 of FIG. 5C, decision block 522 similarly determines if the two selected LO mixing frequencies will be the same ($f_{LO1}=f_{LO2}$). And again, if the answer is "NO," then in block 524, each LO circuitry operates, and first LO mixing frequency ($f_{LO1}$) is not shared. If the answer is "YES," then in block 528, the first tuner output 112A is shared, and the entire second receiver path circuitry is powered down and turned off.

Figure 6B:
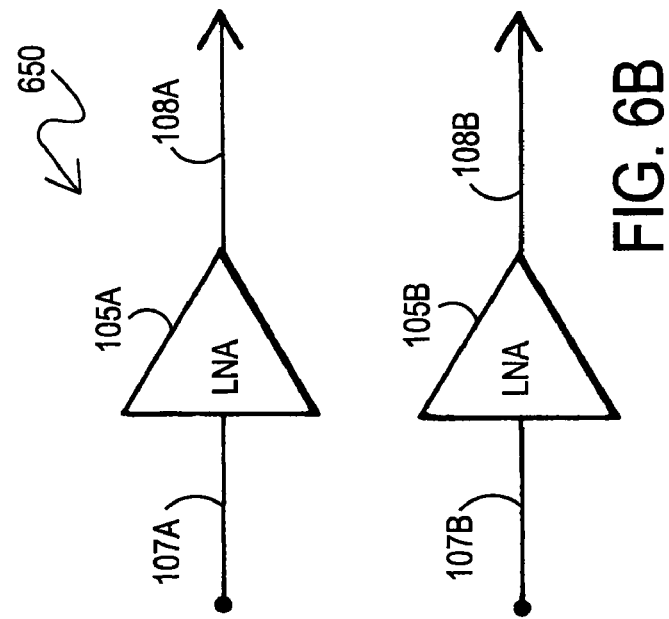
FIGS. 6A and 6B are block diagrams for example embodiments for providing satellite dish signals to satellite set-top box receivers.
Figure 6A:
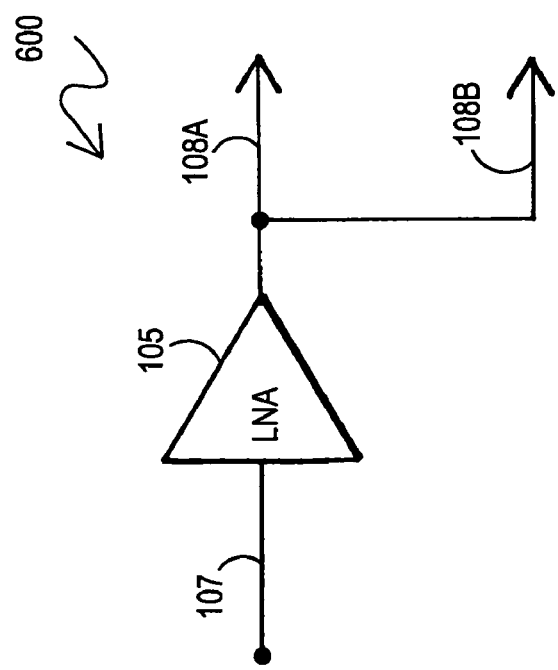

FIGS. 6A and 6B are block diagrams for example implementations for providing satellite dish signals to satellite set-top box dual receiver architectures. In FIG. 6A, there is a single incoming signal 107 from the satellite dish antenna. This incoming satellite spectrum signal 107 is received by LNA 105 and then split into two signals 108A and 108B to provide inputs to each of the two receiver paths. In FIG. 6B, there are two singles 107A and 107B coming the satellite dish antenna. These incoming signals 107A and 107B are then received by two separate LNAs 105A and 105B. LNA 105A provides an output signal 108A for a first receiver path, and LNA 105B provides an output signal 108B for a second receiver path. It is noted that with respect to the embodiment 600 of FIG. 6A, both the solutions of FIGS. 5B and 5C are available. However, with the embodiment 650 of FIG. 6B, the solution of FIG. 5C would not available because the two input satellite transponder channel spectrums 108A and 108B may not be the same and, therefore, sharing the first tuner output 112A may cause errors with respect to the output of the second receiver circuitry.

Figure 7A:
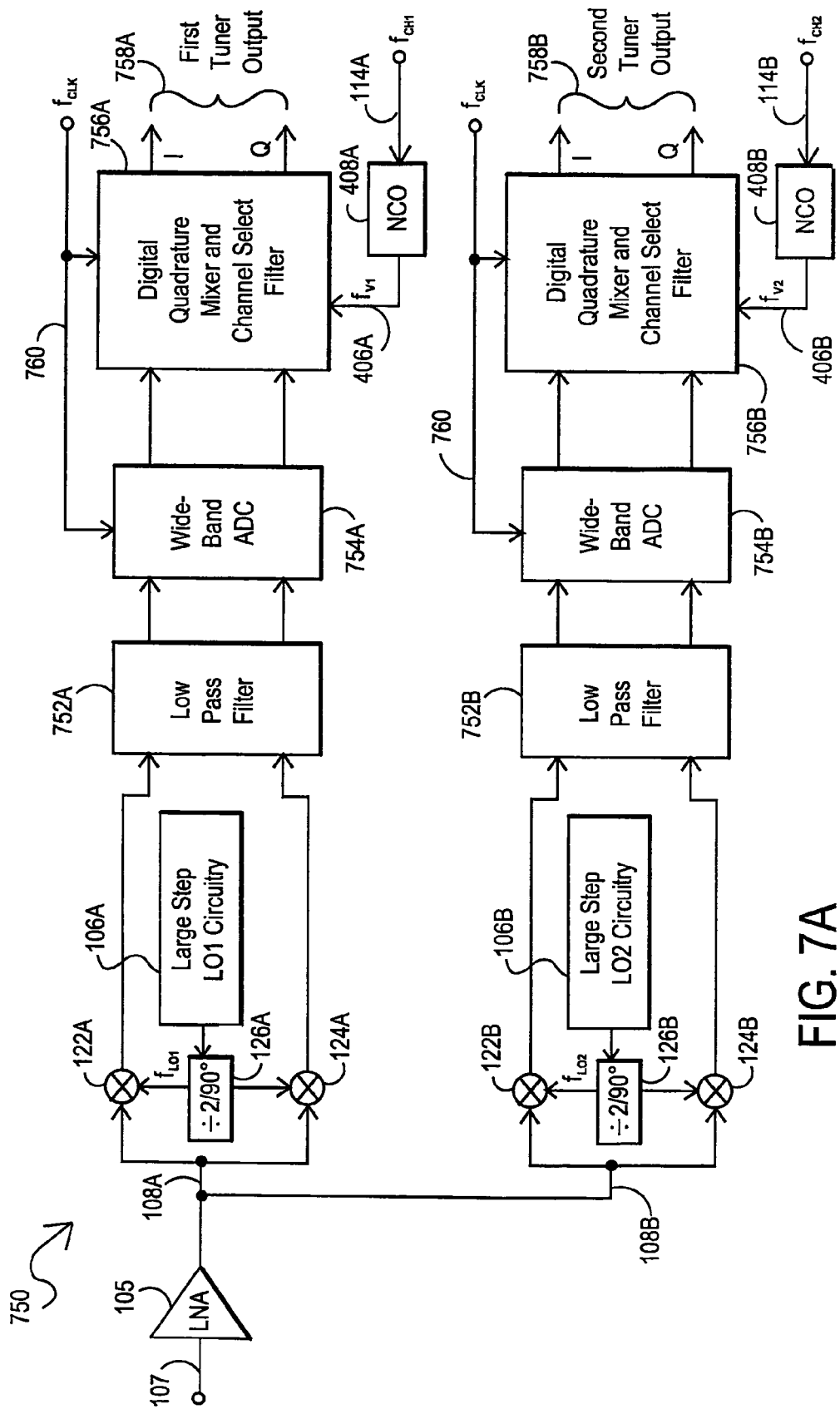
FIG. 7A is a block diagram for an dual receiver implementation of the receiver architecture of the present invention using wide-band analog-to-digital converters.

FIG. 7A is a block diagram for an dual receiver implementation of the receiver architecture of the present invention using wide-band analog-to-digital converters, such as discussed with respect to FIG. 4A above. In embodiment 750, an input signal 107 is received by LNA 105, and LNA 105 provides two input channel spectrum signals 108A and 108B to the two receiver paths. A first receiver path includes mixers 122A and 124A, 90 degree phase shift block 126A, and large-step LO1 circuitry 106A, which together output complex I/Q signals that are coarsely tuned channel spectrum signals. These complex I/Q signals are then processed by a low pass filter 752A, a wide-band ADC 754A and a digital quadrature mixer and channel select filter 756A. A sampling clock ($f_{CLK}$) 760 is provided to the wide-band ADC 754A and the digital quadrature mixer and channel select filter 756A. For fine tuning the desired channel, the digital quadrature mixer and channel select filter 756A utilizes a variable frequency ($f_{V1}$) 406A generated by numerically controlled oscillator (NCO) 408A that in turn receives the center frequency ($f_{CH1}$) 114A for a first desired channel. The first receiver path outputs quadrature I/Q baseband signals 758A as the first tuner output. A second receiver path duplicates the first receiver path and includes mixers 122B and 124B, 90 degree phase shift block 126B, large-step LO2 circuitry 106B, low pass filter 752B, a wide-band ADC 754B and a digital quadrature mixer and channel select filter 756B. As with the first receiver path, a sampling clock ($f_{CLK}$) 760 is provided to the wide-band ADC 754B and the digital quadrature mixer and channel select filter 756B. For fine tuning the desired channel, the digital quadrature mixer and channel select filter 756B utilizes a variable frequency ($f_{V2}$) 406B generated by NCO 408B that in turn receives the center frequency ($f_{CH2}$) 114B for a second desired channel. It is noted that the embodiment 750 could also have additional circuitry for handling overlaps between the first and second LO mixing frequencies ($f_{LO1}$, $f_{LO2}$), as discussed with respect to FIGS. 5A-C and 6A-B above.

Figure 7B:
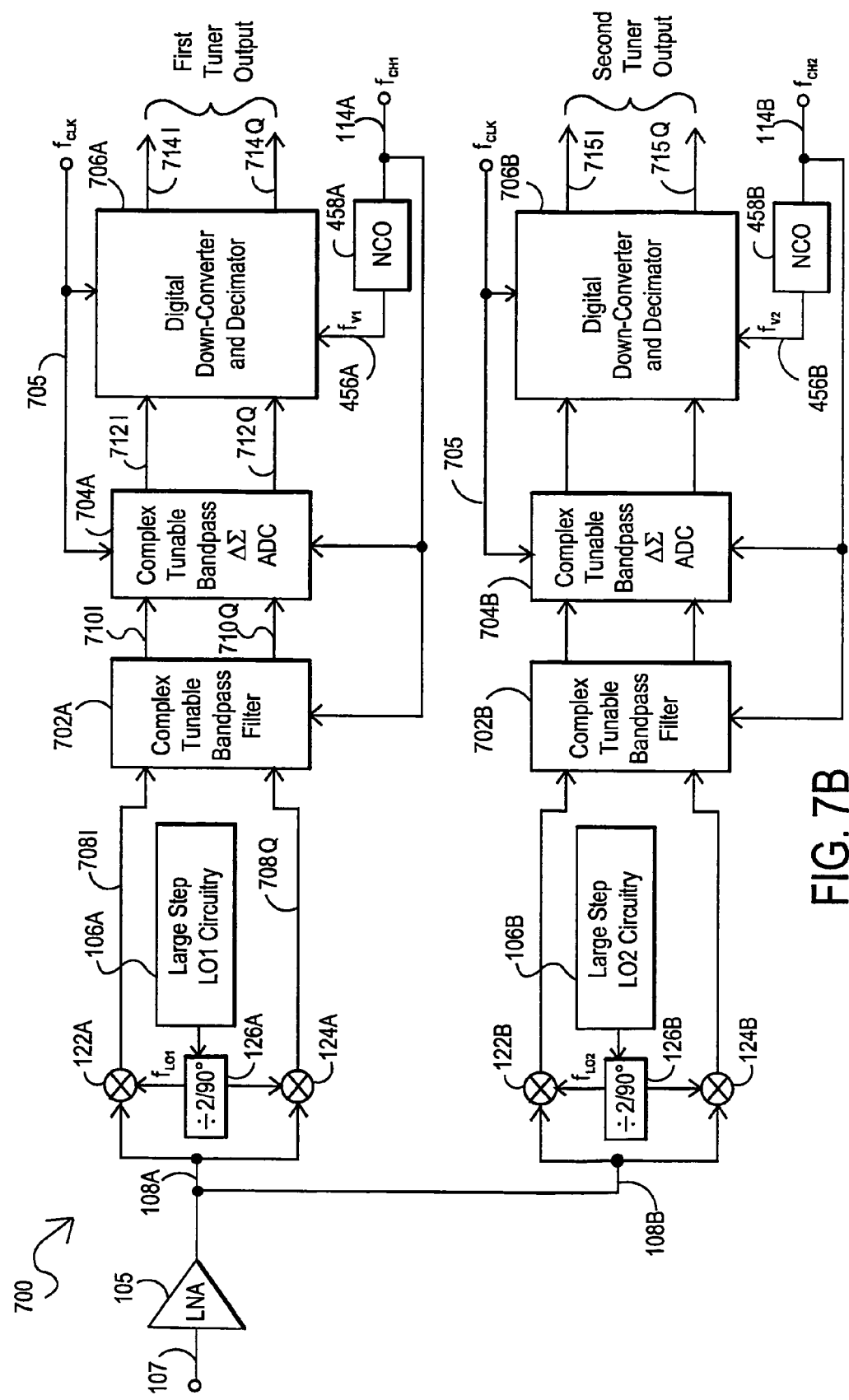
FIG. 7B is a block diagram for an dual receiver implementation of the receiver architecture of the present invention using complex tunable bandpass delta-sigma analog-to-digital converters.

FIG. 7B is a block diagram for a dual receiver implementation of the receiver architecture of the present invention using complex tunable bandpass delta-sigma analog-to-digital converters, such as discussed with respect to FIG. 4B above. In embodiment 700, an input signal 107 is received by LNA 105, and LNA 105 provides two input channel spectrum signals 108A and 108B to the two receiver paths. A first receiver path includes mixers 122A and 124A, 90 degree phase shift block 126A, and large-step LO1 circuitry 106A, which together output complex I/Q signals that are coarsely tuned channel spectrum signals 708I and 708Q. These complex I/Q signals are then processed by a complex tunable bandpass filter 702A with outputs 710I and 710Q, a complex tunable bandpass delta-sigma (ΔΣ) ADC 704A with outputs 712A and 712Q, and a digital down-converter and decimator 706A. A sampling clock ($f_{CLK}$) 705 is provided to complex tunable bandpass ΔΣ ADC 704A and to the digital down-converter and decimator 706A. For digital processing and tuning of the desired channel, the complex tunable bandpass filter 702A and the complex tunable ΔΣ ADC 704A receive the center frequency ($f_{CH1}$) 114A for a first desired channel. For further fine tuning of the desired channel, the digital down-converter and decimator 706A utilizes a variable frequency ($f_{V1}$) 456A generated by numerically controlled oscillator (NCO) 458A that in turn receives the center frequency ($f_{CH1}$) 114A. The first receiver path outputs quadrature I/Q baseband signals 714I and 714Q as the first tuner output. A second receiver path duplicates the first receiver path and includes mixers 122B and 124B, 90 degree phase shift block 126B, large-step LO2 circuitry 106B, complex tunable bandpass filter 702B, a complex tunable bandpass ΔΣ ADC 704B and a digital down-converter and decimator 706B. As with the first receiver path, a sampling clock ($f_{CLK}$) 705 is provided to the complex tunable bandpass ΔΣ ADC 704B and the digital down-converter and decimator 706B. For digital processing and tuning of the desired channel, the complex tunable bandpass filter 702B and the complex tunable ΔΣ ADC 704B receive the center frequency ($f_{CH2}$) 114B for a second desired channel. For further fine tuning of the desired channel, the digital down-converter and decimator 706B utilizes a variable frequency ($f_{V2}$) 456B generated by NCO 458B that in turn receives the center frequency ($f_{CH2}$) 114B. It is noted that the embodiment 750 could also have additional circuitry for handling overlaps between the first and second LO mixing frequencies ($f_{LO1}$, $f_{LO2}$), as discussed with respect to FIGS. 5A-C and 6A-B above.

It is noted that with respect to embodiments of FIGS. 7A and 7B, the required bandwidth for ADCs 754A/B and the tuning range for ADCs 704A/B can be limited to positive frequencies if desired. Negative frequencies can be tuned by applying the complex conjugate of the Q path signal to the filters 102A/B and 752A/B. This negative frequency conversion circuitry, therefore, can be placed after the mixers 124A/B in each of the embodiments 700 and 750. This pre-processing advantageously limits the required processing range for the complex analog processing done by the ADCs 704A/B.

Figure 7C:
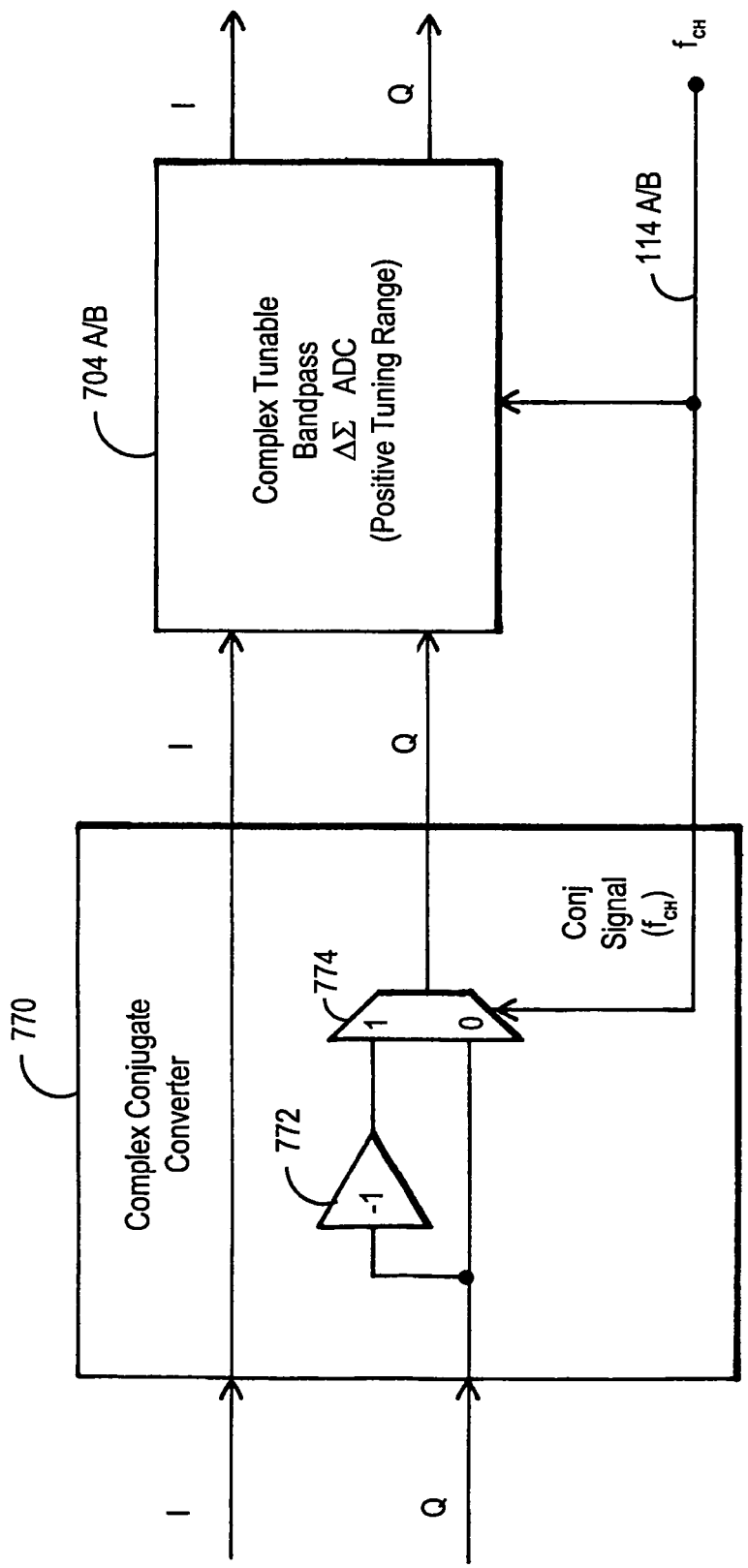
FIG. 7C is a block diagram of an example embodiment for converting negative frequencies to reduce the needed tuning range of a complex tunable bandpass to positive frequencies.

FIG. 7C provides an example embodiment for converting negative frequencies to reduce the needed tuning range of the complex tunable bandpass ΔΣ ADC 704A/B to positive frequencies. As depicted, the I and Q path signals received by the complex tunable bandpass ΔΣ ADC 704A/B are first processed by the complex conjugate converter 770. In the embodiment shown, the I path signal passes through the complex conjugate converter 770 and is provided to the complex tunable bandpass ΔΣ ADC 704A/B. The Q path signal is connected to the "0" input of the multiplexer (MUX) 774. The Q path signal is also connected to gain stage 772 (−1 gain), which in turn provides an output that is connected to the "1" input of the MUX 774. The conjugate signal (CONJ SIGNAL) used to control the MUX 774 is the center frequency ($f_{CH}$) 114A/B that is also utilized by the complex tunable bandpass AZ ADC 704A/B. As stated above, by using this complex conjugate converter to process the I and Q path signals, the complex tunable bandpass ΔΣ ADC 704A/B can be advantageously limited to a positive tuning range thereby reducing the bandwidth requirement for the complex tunable bandpass ΔΣ ADC 704A/B. It is further noted that for a fully differential design, the −1 gain for gain stage 772 can be implemented relatively simply by swapping the two single-ended positive and negative signals that would be received by gain stage 772 in such a fully differential design.

Figure 8A:
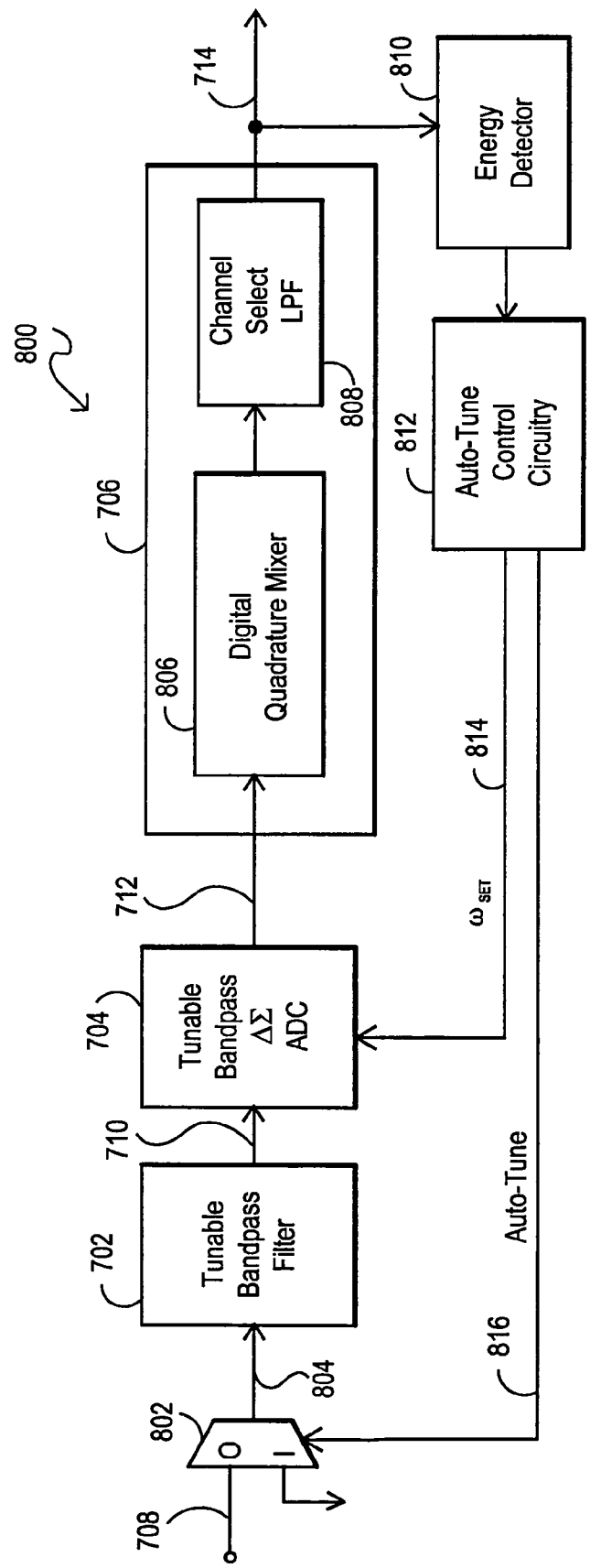
FIG. 8A is a block diagram of an embodiment for adjusting tuning errors with respect to the complex tunable bandpass delta-sigma analog-to-digital converters in the embodiment of FIG. 7B.
Figure 8B:
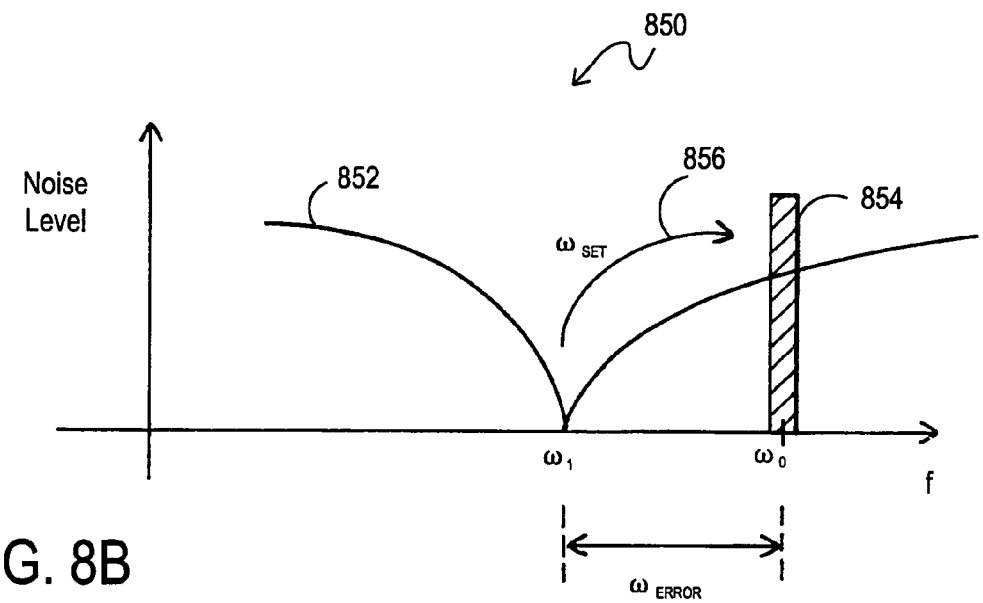
FIG. 8B is a diagram representing the signal correction of FIG. 8A.

FIG. 8A and FIG. 8B are a block diagram and response diagram, respectively, that describe one implementation for calibrating and handling tuning errors in a bandpass delta-sigma converter within a receiver, such as tunable bandpass ΔΣ ADC 704A/B in FIG. 7B. This implementation takes advantage of the result that an improperly tuned delta-sigma converter will typically produce large amounts of noise in the final output of the receiver.

Looking first to FIG. 8A, a block diagram is depicted of an embodiment 800 for calibrating tuning errors with respect to a bandpass delta-sigma converter within a receiver, such as the complex tunable bandpass delta-sigma analog-to-digital converters in the embodiment of FIG. 7B. This embodiment 800 detects energy in the receiver output and provides a tuning offset signal ($\omega_{SET}$) that adjusts the tunable bandpass ΔΣ ADC 704 to correct for errors in its center frequency. Similar to the embodiment 700 of FIG. 7B, embodiment 800 also includes a tunable bandpass filter 702 and a digital down-converter and decimator 706, which itself includes a digital quadrature mixer 806 and a channel select low pass filter (LPF) 808. The output baseband I/Q signals 714 are sent to an energy detector 810 that determines noise in the output signal. The energy detector 810 provides an output to the auto-tune control circuitry 812. The auto-tune control circuitry 812 in turn provides the tuning offset signal ($\omega_{SET}$) to the tunable bandpass ΔΣ ADC 704. And the auto-tune control circuitry 812 also sends an auto-tune control signal 816 to a multiplexer (MUX) 802. The multiplexer 802 chooses between the channel spectrum I/Q signal 708 and ground and outputs a signal 804 to the tunable bandpass filter 702. In operation, if the ΔΣ ADC 704 is mistuned, then the noise within the output baseband I/Q signals 714 will increase. Thus, by adjusting the tuning offset signal ($\omega_{SET}$) 814 to reduce and minimize this noise, the ΔΣ ADC 704 can be tuned or calibrated to compensate for tuning errors in the ΔΣ ADC 704.

FIG. 8B is a diagram representing the signal correction of FIG. 8A. In the noise level representation 850, response line 852 represents the tuning response of the ΔΣ ADC 704. The channel 854 represents a desired channel located at a channel center frequency ($\omega_0$). The ΔΣ ADC 704 is ideally tuned so that its notch falls on the channel center frequency ($\omega_0$); however, the notch for the ΔΣ ADC 704, as shown, is located at a first frequency ($\omega_1$). The difference between the desired notch location at the channel center frequency ($\omega_0$) and the actual notch location at the first frequency ($\omega_1$) represents an error amount ($\omega_{ERROR}$) in the tuning for the ΔΣ ADC 704. As represented by line 856, the tuning offset signal ($\omega_{SET}$) acts to move the notch for the ΔΣ ADC 704 so that it more closely aligns with the channel center frequency ($\omega_0$). As depicted in FIG. 8B, the center frequency ($\omega_0$) for the desired channel 854 is offset from the notch for the ΔΣ ADC 704. In operation, the digital quadrature mixer 806 would multiply the mistuned output of the ΔΣ ADC 704 by $\exp(-j\omega_0 n)$ thereby causing significant noise in the desired output channel 854, which was selected and tuned by the channel select LPF 808. Thus, due to the tuning error ($\omega_{ERROR}$) in the ΔΣ ADC 704, the noise at the output 714 will be much greater than for circumstance where this error is adjusted so that it approaches zero.

As indicated above, the technique of FIG. 8A and FIG. 8B takes advantage of the knowledge that an improperly tuned delta-sigma converter notch will produce large amounts of noise in the channel tuned by a channel select filter 808. During auto-tune in the embodiment depicted, the input to the ΔΣ ADC 704 could be forced to zero by selecting ground through the MUX 802. The output energy can then be minimized by adjusting the tuning offset signal ($\omega_{SET}$) 814 and thereby adjusting the tuning error ($\omega_{ERROR}$). Once a minimum is found, the auto tuning or calibration could be completed and normal operation could proceed by changing the selection of MUX 802 to the input channel spectrum I/Q signal 708. It is noted that a auto-tune algorithm could implemented utilizing 30 to 60 discrete settings for the tuning offset signal ($\omega_{SET}$) 814, such that the auto-tune algorithm could be executed very rapidly. In addition, the auto-tune algorithm could be executed each time a different channel were selected. And this auto-tune procedure and implementation could also be used to calibrate a bandpass filter, such as tunable bandpass filter 702, that sits in front of the ΔΣ ADC 704. In this case, a master-slave approach could be used, if desired, such that the filter is constructed using similar (or matched) complex integrators as used by the circuitry of the ΔΣ ADC 704, as discussed below with respect to FIG. 8C. It is further noted that the clock provided to the device that drives the sampling of the ΔΣ ADC 704 and the digital quadrature mixer 806 can be used as an accurate time reference for the auto-tune implementation.

Figure 8C:
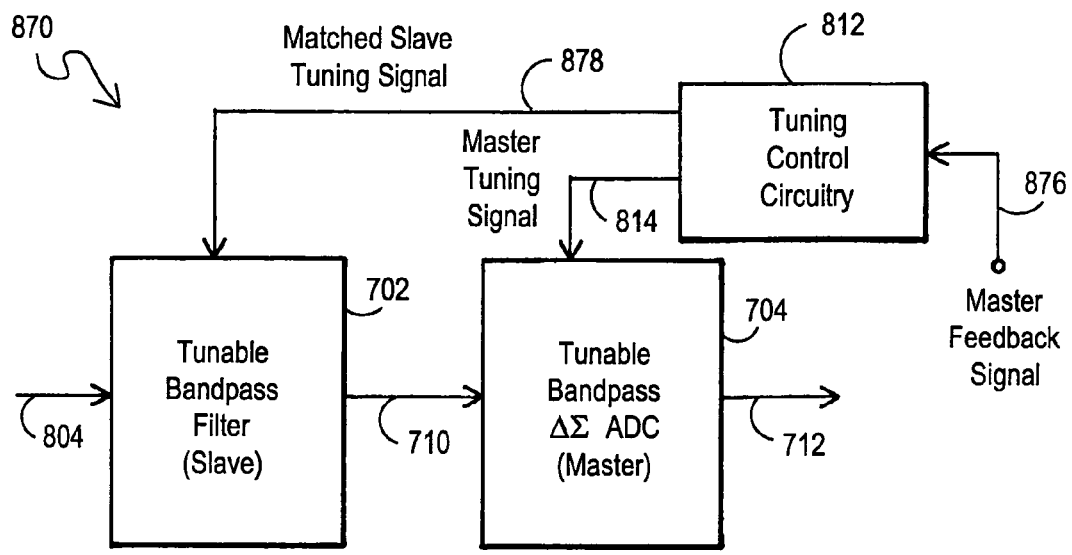
FIG. 8C is a block diagram for a master-slave tuning arrangement between a tunable bandpass analog-to-digital converter (master) and a tunable bandpass filter (slave).

FIG. 8C is a block diagram for a master-slave tuning arrangement 870 between a tunable bandpass analog-to-digital converter (master) and a tunable bandpass filter (slave). In general, master-slave tuning of second circuit (slave) based upon a first circuit (master) is typically implemented by building the second circuit out of similar or identical circuit building blocks as the first circuit. One can then fine tune the building blocks of the first circuit through a feedback methodology. The control (or offset) signals which are derived out of the feedback methodology are applied not only to the first circuit but also to the second circuit as well. Because the second circuit was not a part of this feedback operation, the second circuit can be tuned by the notion of similarity (or matching). The second circuit, in this case, is called the slave whereas the first circuit involved in the feedback operation is called the master. Usually, the circuit selected as the master circuit will have a topology that is reasonably amenable to a feedback methodology where as the circuit selected as the slave circuit is often not amenable to a feedback operation. One typical example of a master-slave tuning implementation is fine tuning of a filter by slaving it into an oscillator which has the same integrators.

Looking back to FIG. 8C, the embodiment depicted utilizes the tunable bandpass ΔΣ ADC 704 as the master tuning circuit that allows for fine tuning of the tunable bandpass filter 702, which is the slave circuit. To implement this master-slave approach, for example, the tunable bandpass ΔΣ ADC 704 can be built out of identical or similar complex integrators as used for the filter 702. In operation, some feedback operation is conducted on the output 712 of the tunable bandpass ΔΣ ADC 704, and a master feedback signal 876 is produced. This master feedback signal 876 is applied to the tuning control circuitry 812, which in turn provides a master tuning signal 814 to the tunable bandpass ΔΣ ADC 704. This feedback operation, for example, may be the energy detection implementation discussed above with respect to FIGS. 8A and 8B. In addition, the master tuning signal 814 may be the tuning offset signal ($\omega_{SET}$) 814, and the input signal to the tunable bandpass filter 702 could be the input signal 804, as discussed above with respect to FIGS. 8A and 8B. Once the feedback operation and the tuning control circuitry has tuned the tunable bandpass ΔΣ ADC 704, the master tuning signal 814 is the applied by similarity (or matching) to the tunable bandpass filter 702 as the matched slave tuning signal 878.

FIGS. 9A-9E are block and signal diagrams that describe implementations for the digital down-converter and decimator 706A/B of FIG. 7B. These implementations utilize multiple stages of digital mixing and down conversion to bring the output 712 of the bandpass ΔΣ ADC 704A/B to baseband I/Q signals. The output 712 of the bandpass ΔΣ ADC 704A/B, for example, can be a complex 1-bit digital signal sampled at $F_S$ with quantization noise shaping designed to have a minimum centered at the desired channel center frequency ($\omega_0$). The multi-staged implementation incrementally filters and decimates this signal to reduce the design requirements of each stage.

Figure 9A:
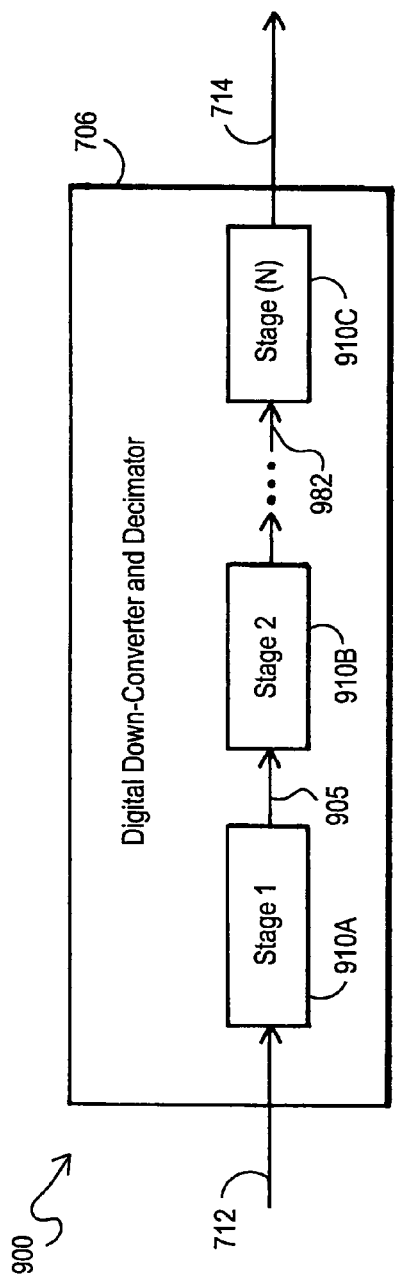
FIG. 9A is a block diagram of a multi-stage architecture for a digital down-converter and decimator usable in the embodiment of FIG. 7B.

FIG. 9A is a block diagram of the multi-stage architecture 900 for a digital down-converter and decimator 706 usable in the embodiment 700 of FIG. 7B. The input 712 from a bandpass ΔΣ ADC 704 is processed by a series of cascaded stages, which as shown include STAGE1 910A, STAGE2 910B . . . STAGE(N) 910C. Each stage provides an output to the next stage, as indicated by signal 905 from STAGE1 910A to STAGE2 910B and by signal 982 that would be from STAGE (N−1) to STAGE(N) 910C. It is noted that the stages 910A, 910B . . . 910C (STAGE1, STAGE2 . . . STAGE(N)) could all be implemented with similar circuitry, if desired.

Figure 9B:
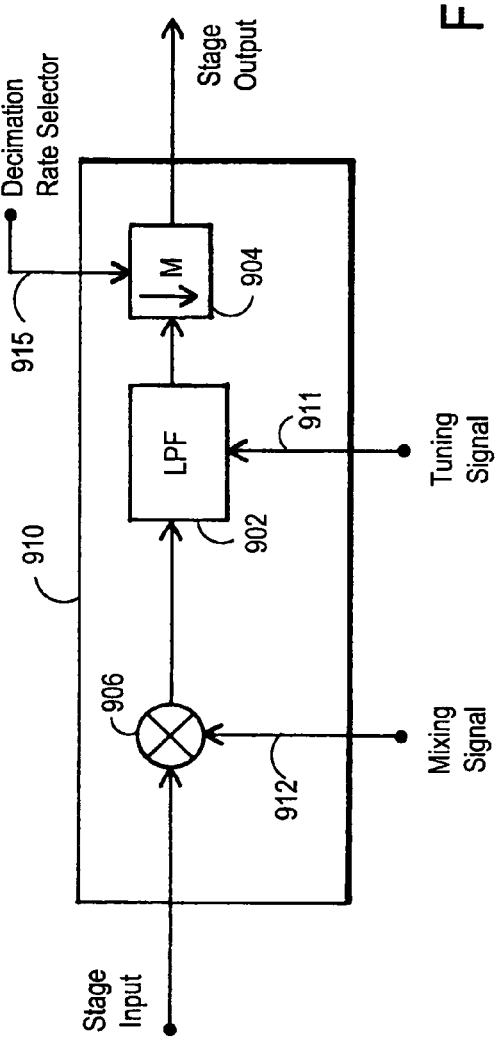
FIG. 9B is a block diagram of example stages for the architecture of FIG. 9A.

FIG. 9B is a block diagram of example circuitry for stages 910 within the multi-stage architecture of FIG. 9A. In the stage embodiment depicted, the stage input is received by mixer 906, which digitally mixes the stage input with a mixing signal 912. The resulting signal is passed through a low pass filter (LPF) 902. This LPF 902 can be tunable, if desired, and the tuning signal 911 can be used to tune the tunable LPF 902. The output of the LPF 902 is then decimated down by decimator 904 to provide the stage output. The decimator 904 can have a fixed decimation rate, if desired, or can have a variable decimation rate (down-by-M) that is controlled by decimation rate selector signal 915. The output signal from the stage 910 is then sent to the next stage. For example, where the stage is the STAGE1 910A, the input signal to the stage would be signal 712 from the ΔΣ ADC 704, and the output signal would be signal 905 that is received by STAGE2 910B. It is noted that the values for the digital mixing signal 912 and the decimation rate for the decimator 904 in each stage can be selected, as desired, depending upon the spectrum segmentation strategy selected.

Figure 9C:
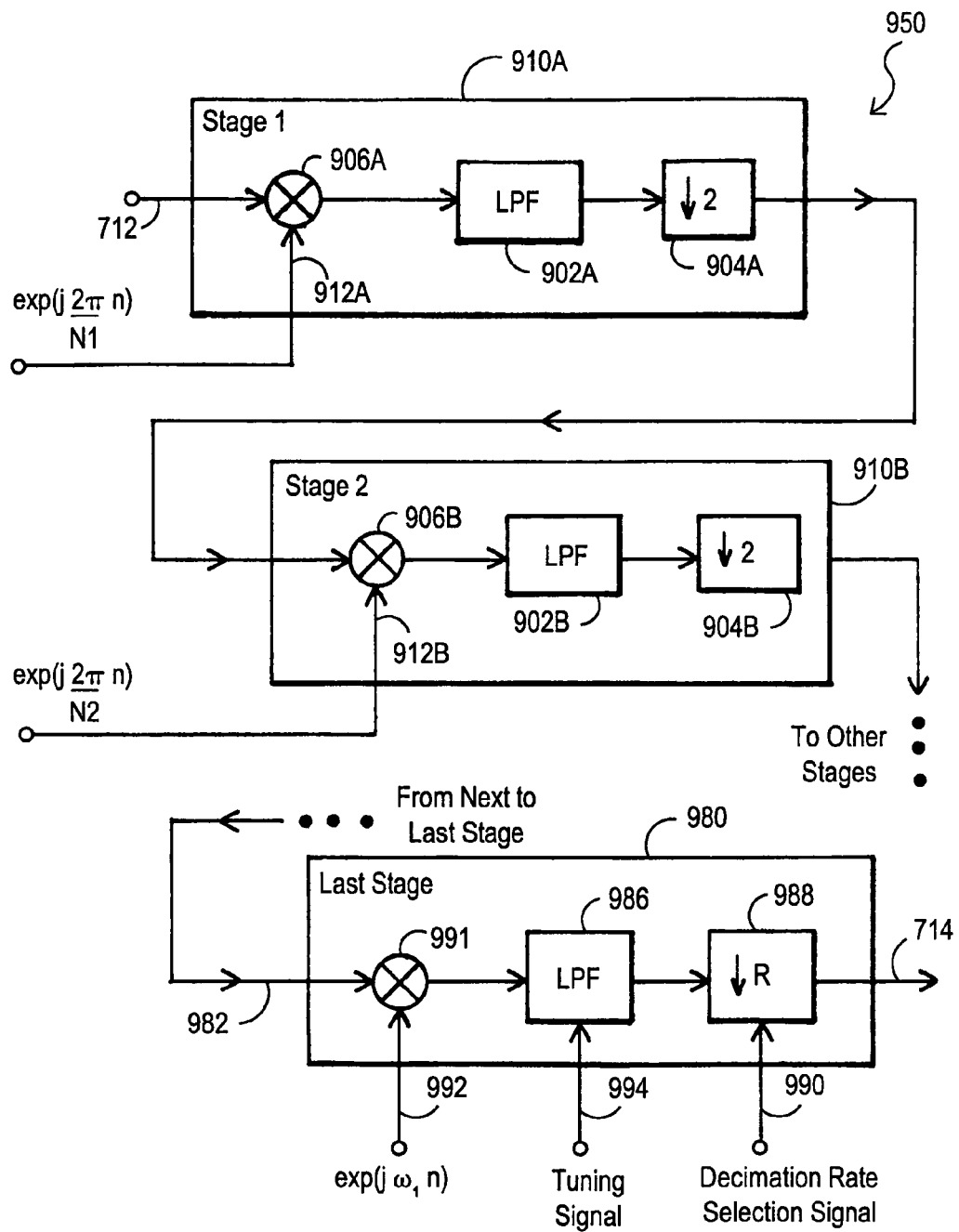
FIG. 9C is a block diagram of example implementation of the architecture of FIG. 9A utilizing a fixed decimation in the non-final stages and a variable decimation rate in the final stage.
Figure 9D:
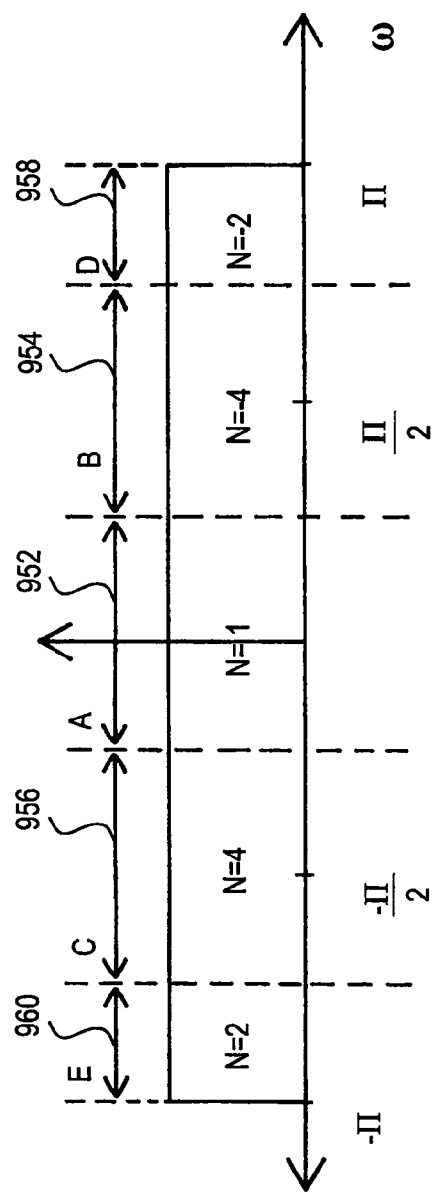
FIG. 9D is a diagram for determining a factor (N) used in the non-final stage implementations of FIG. 9C.
Figure 9E:
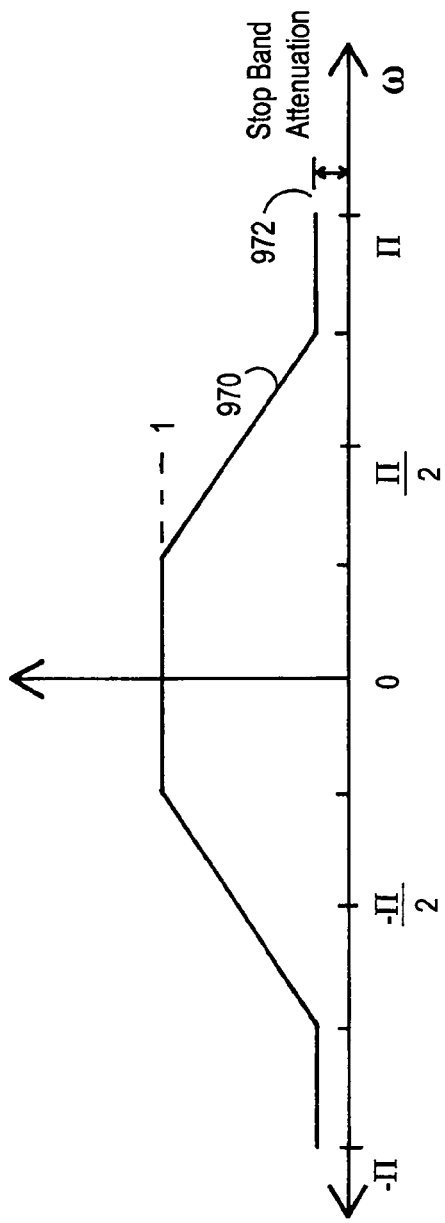
FIG. 9E is a response diagram of an example low pass filter for the non-final stage implementations of FIG. 9C.

FIGS. 9C, 9D and 9E described an example implementation of the multi-stage architecture of FIG. 9A utilizing a plurality of identical or similar non-final stages followed by a final stage that brings the signal down to a desired or optimal signal processing rate.

First, looking to FIG. 9C, a block diagram is depicted for example implementation 950 of the architecture of FIG. 9A utilizing a fixed decimation rate in non-final stages and a variable decimation rate in the final stage. In this embodiment 950, the fixed decimation rate stages, or non-tunable stages, include one or more cascaded stages. There are two example non-final, non-tunable stages depicted, namely STAGE1 910A and STAGE2 910B. STAGE1 910A receives the input signal 712 processes it with mixer 906A, LPF 902A and down-by-two decimator 904A before providing an output signal to the next stage. STAGE2 910B uses the same or similar structure and processes the signal from STAGE1 910A with mixer 906B, LPF 902B and down-by-two decimator 904B before providing an output signal to the next stage. In the embodiment depicted, the mixers 906A, 906B digitally mix their respective input signals with mixing signals 912A, 912B, and these mixing signals 912A, 912B . . . used by each stage are represented by the formula: $\exp[j(2\pi/N)n]$ where $N=\{\pm1, \pm2, \pm4\}$ and where "n" represents the time sequence index. In addition, as shown in FIG. 9C, each stage can use a different exponential source as a mixing signal with each mixing signal using a different N, such as N1 for mixing signal 912A, N2 for mixing signal 912B, and so on, where $N1, N2, \ldots = \{\pm1, \pm2, \pm4\}$. As discussed further below with respect to FIG. 9D, for each non-tunable stage in FIG. 9C, the digital mixer 906 for the stage can be configured to digital mix the input to the stage with a mixing signal selected from a plurality of predetermined mixing signals that are chosen to reduce complexity for calculations used for the digital mixing. In addition, the mixing signal selected for a particular stage (as determined in this embodiment with N1 for stage 910A, N2 for stage 910B, and so on) can be made to depend upon the location of the channel center frequency within the input signal to the stage so that the spectrum for the input signal is rotated such that the desired channel falls within a desired frequency range.

For the last stage 980, the input signal 982 from the next to last stage is first processed by mixer 991, which digitally mixes the signal 982 with a mixing signal 992 represented by the formula: $\exp[j\omega_1 n]$ where "$\omega_1$" represents the frequency of the desired channel and where "n" represents the time sequence index. The resulting mixed signal is then sent to LPF 986, which may be a tunable LPF, if desired. If tunable, the LPF 986 can be tuned utilizing the tuning signal 994. The output from LPF 986 is then decimated by variable decimator 988 (divide-by-R). A decimation rate selection signal 990 provides a control signal to the variable decimator 988 to determine its decimation rate. The resulting output signal 714 provides the output baseband I/Q signals for the embodiment 700 of FIG. 7B.

FIG. 9D is a diagram for determining a factor (N) used in the non-final stage implementations of FIG. 9C based upon the frequency location ($\omega$) of the desired channel. Frequency ranges 952, 954, 956, 958 and 960 represent various ranges within which a desired channel may be located within the output of the bandpass ΔΣ ADC 704. Depending upon the frequency range within which the desired channel falls, the value for "N" will be set to a particular value for the equation that describes the mixing signal 912. Region A, represented by range 952, spans from $-\pi/4$ to $\pi/4$ and uses N=1. Region B, represented by range 954, spans from $\pi/4$ to $3\pi/4$ and uses N=−4. Region C, represented by range 956, spans from $-3\pi/4$ to $-\pi/4$ and uses N=4. Region D, represented by range 958, spans from $3\pi/4$ to $\pi$ and uses N=−2. And region E, represented by range 960, spans from $-\pi$ to $-3\pi/4$ and uses N=2. Advantageously, for this implementation, the digital multiplies that must occur in digital mixer 906 are relatively trivial:

$N=\pm1: \exp[j2\pi n] = \ldots 1,1,1,1, \ldots$ $N=\pm2: \exp[\pm j\pi n] = \ldots 1,-1,1,-1, \ldots$ $N=\pm4: \exp[j(\pi/2)n] = \ldots 1,j,-1,-j, \ldots$ $N=-4: \exp[-j(\pi/2)n] = \ldots 1,-j,-1,j, \ldots$ In operation, the desired channel will lie somewhere in the range of frequencies defined by regions A, B, C, D and E. Because the location of the channel is known, the value for "N" can be set to the proper value, as indicated above, such that after multiplication in digital mixer 906, the spectrum is rotated and the desired channel is within region A.

FIG. 9E is a response diagram of an example low pass filter 902 for the non-final stage implementations of FIG. 9C. The line 970 represents the relevant response for the LPF 902 depending upon the frequency location ($\omega$) of the desired channel. The gap 972 represents a stop band attenuation for the LPF 902.

In operation, the multi-stage implementation 950 described with respect to FIGS. 9C, 9D and 9E uses a plurality of non-final cascaded stages that each include digital mixers to multiply the output of the ΔΣ ADC 704 in order to center the signal near $\omega=0$ and that each applies the mixer output to a low pass filter and a down-by-two decimator. The final stage is designed to have variable decimation so that the channel to be tuned is finally decimated to the baseband rate. Advantageously, by breaking up the digital mixing into multiple stages, this implementation reduces power requirements at the highest sample rates, reduces the resolution required for the digital mixers, and reduces the complexity of each stage including the final stage.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures for database processing. For example, equivalent elements may be substituted for those illustrated and described herein, and certain features of the invention may be utilized independently of the use of other features, all as would be apparent to one skilled in the art after having the benefit of this description of the invention.

What is claimed is:

1. A method for tuning a channel within a signal spectrum, comprising:
    receiving a signal spectrum including a plurality of channels within a frequency range;
    receiving a channel selection signal identifying at least one desired channel to be tuned;
    selecting one of a plurality of predetermined analog mixing signals depending upon a location of the desired channel within the signal spectrum;
    mixing the signal spectrum with the selected analog mixing signal to mix the desired channel down to a variable location within a frequency range around DC and not to a fixed target frequency, the variable location being dependent upon the location of the desired channel within the signal spectrum arid the selected analog mixing signal;
    converting the desired channel at the variable frequency location to digital signals; and digitally processing the digital signals.

2. The method of claim 1, wherein the signal spectrum comprises a channel signal spectrum from satellite communications, the satellite channel signal spectrum comprising a plurality of transponder channels with each transponder channel including a plurality of program channels.

3. The method of claim 1, further comprising separating the frequency range of the signal spectrum into a plurality of frequency bins and associating at least one analog mixing signal with each frequency bin.

4. The method of claim 3, wherein the selecting step comprises determining within which bin the desired channel falls and selecting the analog mixing signal associated with that bin.

5. The method of claim 4, wherein the selecting step further comprises selecting a different analog mixing signal if the desired channel overlaps the analog mixing signal associated with the bin within which the desired channel falls.

6. The method of claim 3, further comprising configuring the frequency bins not to overlap.

7. The method of claim 3, further comprising configuring the frequency bins such that one or more of the frequency bins overlap in frequency ranges.

8. A receiver for tuning a channel within a signal spectrum, comprising:
    mixing circuitry having an analog mixing signal as an input and having a signal spectrum as an input, the signal spectrum including a plurality of channels within a frequency range;
    local oscillator (LO) circuitry having a channel selection signal as an input and having the analog mixing signal as an output, the analog mixing signal being selected from a plurality of predetermined analog mixing signals depending upon a location of a desired channel to be tuned within the signal spectrum such that the desired channel is mixed down to a variable location within a frequency range around DC and not to a fixed target frequency, the variable location being dependent upon the location of the desired channel within the signal spectrum and the selected analog mixing signal;
    analog to digital conversion circuitry configured to convert the desired channel at the variable frequency location to digital signals; and
    digital processing circuitry configured to digitally process the digital signals.

9. The receiver of claim 8, wherein the signal spectrum comprises a channel signal spectrum from satellite communications, the satellite channel signal spectrum comprising a plurality of transponder channels with each transponder channel including a plurality of program channels.

10. The receiver of claim 8, wherein the frequency range of the signal spectrum is organized into a plurality of frequency bins and wherein at least one coarse-tune analog mixing signal is associated with each frequency bin.

11. The receiver of claim 10, wherein the analog mixing signal selected for output by the LO circuitry is an analog mixing signal associated with the bin within which the desired channel falls.

12. The receiver of claim 11, wherein a different analog mixing signal is selected by the LO circuitry if the desired channel overlaps the analog mixing signal associated with the bin within which the desired channel falls.

13. The receiver of claim 10, further comprising configuring the frequency bins not to overlap.

14. The receiver of claim 10, further comprising configuring the frequency bins such that one or more of the frequency bins overlap in frequency ranges.

15. The receiver of claim 8, wherein the LO circuitry comprises phase-lock-loop (PLL) circuitry including a phase detector and a controlled oscillator, the phase detector receiving a first signal representative of a reference frequency, receiving a second signal representative of an output frequency of the controlled oscillator, and generating at least one control signal to adjust the output frequency of the controlled oscillator.

16. The receiver of claim 15, wherein the LO circuitry further comprises control circuitry configured to receive a channel selection signal and to control divider circuitry that provides the first and second signals to the phase detector based upon divided versions of the reference frequency and the output of the controlled oscillator, the control circuitry acting to select the coarse-tune analog mixing signal output by the PLL circuitry.

17. The receiver of claim 15, wherein the controlled oscillator utilizes an RC-based resonant structure.

18. A satellite set-top box for tuning a program channel within a satellite signal spectrum, comprising:
    a receiver configured to receive a satellite signal spectrum including a plurality of transponder channels and to tune a transponder channel within the signal spectrum, each transponder channel including a plurality of program channels, comprising:
        mixing circuitry having an analog mixing signal as an input and having a signal spectrum as an input, the signal spectrum including a plurality of channels within a frequency range;
        local oscillator (LO) circuitry having a channel selection signal as an input and having the analog mixing signal as an output, the analog mixing signal being selected from a plurality of predetermined analog mixing signals depending upon a desired channel to be tuned such that desired channels are mixed down to variable locations with a frequency range around DC based upon the desired channel and the selected analog mixing signal rather than being mixed down to a fixed frequency; and
        digital processing circuitry having an output from the mixing circuitry as an input and having as an output digital baseband signals for the desired channel; and
    a demodulator coupled to receive a digital baseband output signal from the receiver representative of a tuned transponder channel, the demodulator being configured to tune a program channel within the tuned transponder channel and to provide the tuned program channel as an output.

19. The satellite set-top box of claim 18, wherein the frequency range of the signal spectrum is organized into a plurality of frequency bins and wherein at least one coarse-tune analog mixing signal is associated with each frequency bin.

20. The satellite set-top box of claim 19, wherein the analog mixing signal selected for output by the LO circuitry is an analog mixing signal associated with the bin within which the desired transponder channel falls.

* * * * *

UNITED STATES PATENT AND TRADEMARK OFFICE
CERTIFICATE OF CORRECTION

PATENT NO. : 7,904,040 B2
APPLICATION NO. : 12/004006
DATED : March 8, 2011
INVENTOR(S) : Ramin Khoini-Poorfard et al.

It is certified that error appears in the above-identified patent and that said Letters Patent is hereby corrected as shown below:

In claim 1, column 17, line 19, delete "arid" and insert --and--.

Signed and Sealed this
Nineteenth Day of April, 2011

David J. Kappos
*Director of the United States Patent and Trademark Office*